(12) United States Patent
Wang et al.

(10) Patent No.: US 10,921,651 B2
(45) Date of Patent: Feb. 16, 2021

(54) DISPLAY PANEL, DISPLAY DEVICE, AND METHOD FOR MANUFACTURING DISPLAY PANEL HAVING AN ORTHOGRAPHIC PROJECTION OF THE SUPPORT SECTIONS ONTO THE BASE SUBSTRATE

(71) Applicant: SHANGHAI TIANMA MICRO-ELECTRONICS CO., LTD., Shanghai (CN)

(72) Inventors: Lei Wang, Shanghai (CN); Mingwei Zhang, Shanghai (CN); Xiangjian Kong, Shanghai (CN); Jin'e Liu, Shanghai (CN); Feng Qin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 39 days.

(21) Appl. No.: 16/186,577

(22) Filed: Nov. 11, 2018

(65) Prior Publication Data

US 2019/0079328 A1 Mar. 14, 2019

(30) Foreign Application Priority Data

Jun. 29, 2018 (CN) .......................... 2018 1 0713878

(51) Int. Cl.
*G02F 1/1339* (2006.01)
*G02F 1/1368* (2006.01)
(Continued)

(52) U.S. Cl.
CPC ........ *G02F 1/13394* (2013.01); *G02F 1/1368* (2013.01); *G02F 1/13624* (2013.01);
(Continued)

(58) Field of Classification Search
CPC ............ G02F 1/13394; G02F 1/13624; G02F 1/1368; G02F 1/133553; H01L 27/124; H01L 27/1259
See application file for complete search history.

(56) References Cited

U.S. PATENT DOCUMENTS

2007/0228411 A1 10/2007 Lee et al.
2011/0175941 A1 7/2011 Miyake et al.
(Continued)

FOREIGN PATENT DOCUMENTS

CN 102364390 A 2/2012
CN 102566133 A 7/2012
(Continued)

OTHER PUBLICATIONS

Office Action of CN Patent Application No. 201810713878.8 dated Oct. 21, 2020.

*Primary Examiner* — Allen L Parker
*Assistant Examiner* — Charles N Ausar-El
(74) *Attorney, Agent, or Firm* — Kilpatrick Townsend & Stockton, LLP

(57) ABSTRACT

A display panel, a display device, and a method for manufacturing a display panel are provided. The display panel includes an array substrate, a color film substrate, and support pillars located between the array substrate and the color filter substrate. The array substrate includes sub-pixels, multiple gate lines, multiple data lines and a common electrode line. The common electrode line includes a first wire portion extending in a first direction and located between two adjacent sub-pixels. The data lines include multiple support sections each located at an intersection of the data line with the first wire portion. An orthographic projection of each of the support sections on the base
(Continued)

substrate is a support region. A side of the support pillar close to the array substrate is located in the support region.

20 Claims, 20 Drawing Sheets

(51) Int. Cl.
  *H01L 27/12* (2006.01)
  *G02F 1/1362* (2006.01)
  *G02F 1/1335* (2006.01)

(52) U.S. Cl.
  CPC ...... *G02F 1/136286* (2013.01); *H01L 27/124* (2013.01); *H01L 27/1259* (2013.01); *G02F 1/133553* (2013.01)

(56) References Cited

U.S. PATENT DOCUMENTS

| | | |
|---|---|---|
| 2012/0257134 A1 | 10/2012 | Sun et al. |
| 2014/0036193 A1 | 2/2014 | Jeong et al. |
| 2015/0177543 A1 | 6/2015 | Kimura |
| 2015/0362776 A1* | 12/2015 | Jikumaru ............ G02F 1/13394 349/12 |
| 2016/0041316 A1 | 2/2016 | Wang |
| 2016/0170263 A1 | 6/2016 | Arai et al. |
| 2017/0184900 A1* | 6/2017 | Jang .................. G02F 1/133512 |
| 2019/0101789 A1 | 4/2019 | Wang et al. |

FOREIGN PATENT DOCUMENTS

| | | |
|---|---|---|
| CN | 104049417 A | 9/2014 |
| CN | 104199211 A | 12/2014 |
| CN | 105223745 A | 1/2016 |
| CN | 204945560 U | 1/2016 |
| CN | 105785635 A | 7/2016 |
| CN | 106019670 A | 10/2016 |
| CN | 107037628 A | 8/2017 |
| CN | 107505762 A | 12/2017 |
| CN | 107589610 A | 1/2018 |
| JP | 4995942 B2 | 8/2012 |
| KR | 20070068577 A | 7/2007 |

* cited by examiner

DISPLAY PANEL, DISPLAY DEVICE, AND METHOD FOR MANUFACTURING DISPLAY PANEL HAVING AN ORTHOGRAPHIC PROJECTION OF THE SUPPORT SECTIONS ONTO THE BASE SUBSTRATE

CROSS REFERENCE TO RELATED APPLICATION

The present application claims priority to Chinese Patent Application No. 201810713878.8, titled "DISPLAY PANEL, DISPLAY DEVICE, AND METHOD FOR MANUFACTURING DISPLAY PANEL", filed on Jun. 29, 2018 with the State Intellectual Property Office of the People's Republic of China, which is incorporated herein by reference in its entirety.

FIELD

The present disclosure relates to the field of display, and in particular to a display panel, a display device, and a method for manufacturing a display panel.

BACKGROUND

With the development of technology, more and more electronic devices having display functions are widely applied in people's daily life and work, which bring great convenience and become important tools.

The displaying function of the electronic device is mainly implemented by a display panel, which is usually a liquid crystal display panel nowadays. The liquid crystal display panel includes: an array substrate and a color filter substrate opposite to each other, and a support pillar arranged between the array substrate and the color filter substrate. In order not to affect the display effect of the display panel, the support pillar is usually arranged in a region where the gate line is located in the array substrate. In the existing display panel, in order to reduce power consumption, the sub-pixel usually includes two driving regions, and a thin film transistor and the gate line are arranged between the two driving regions. The region where the gate line is located in the array substrate has a poor flatness, because there is a concave region around the gate line. Generally, in order to obtain a large sub-pixel region, the diameter of the support pillar is greater than the width of the gate line. Therefore, the area for bearing the pressure of the pressed support pillar is actually a region of the support pillar overlapping with the gate line, resulting in a poor supporting effect. In addition, when the support pillar is subjected to a force, the support pillar may be inclined and thus slide into the concave region, which results in an even worse supporting effect of the support pillar.

SUMMARY

In view of the above, a display panel is provided in the present disclosure. The display panel includes an array substrate and a color filter substrate opposite to each other, and support pillars located between the array substrate and the color filter substrate. The array substrate includes multiple sub-pixels arranged in an array, multiple gate lines extending in a first direction, and multiple data lines extending in a second direction. The first direction is nonparallel with the second direction. The array substrate further includes a common electrode line. The common electrode line includes a first wire portion extending in the first direction. The first wire portion is located between adjacent sub-pixels among the multiple sub-pixels. Each of the multiple sub-pixels includes a first driving region and a second driving region arranged in the second direction. The gate lines are located between the first driving region and the second driving region. The array substrate includes a base substrate. Each of the data lines includes multiple support sections each located at an intersection of the data line with the first wire portion, and an orthographic projection of each of the support sections on the base substrate is a support region. A side of the support pillar close to the array substrate is located in the support region.

A display device is provided in the present disclosure, which includes the display panel described above.

A method for manufacturing a display panel is provided in the present disclosure. The method includes: providing a base substrate; forming, on the base substrate, multiple sub-pixels arranged in an array, multiple gate lines extending in a first direction, multiple data lines extending in a second direction, and a common electrode line, to form an array substrate; and arranging the array substrate opposite to a color filter substrate, with support pillars located between the array substrate and the color filter substrate. The first direction is nonparallel with the second direction. The common electrode line includes a first wire portion extending in the first direction. The first wire portion is located between adjacent sub-pixels among the multiple sub-pixels. Each of the multiple sub-pixels includes a first driving region and a second driving region arranged in the second direction. The gate lines are located between the first driving region and the second driving region. Each of the data lines includes multiple support sections each located at an intersection of the data line with the first wire portion, and an orthographic projection of each of the support sections on the base substrate is a support region. A side of the support pillar close to the array substrate is located in the support region.

Compared with the conventional technology, the display panel, the display device, and the method for manufacturing the display panel provided in the present disclosure have at least the following beneficial effects.

The length of the first wire portion in the second direction can be greater than the length of the support pillar in the second direction. Compared with the gate line, the first wire portion is more suitable to place the support pillar, effectively improving the support stability of the support pillar. The orthographic projection of each of the support sections on the base substrate is a support region, and the side of the support pillar close to the array substrate is located in the support region. That is, the side of the support pillar close to the array substrate is located at the intersection of the first wire portion with the data line, effectively avoiding a change in structures of the first driving region and the second driving region in the case of the support pillar being arranged in other regions of the first wire portion in the display panel, thereby effectively improving the display quality of the display panel.

BRIEF DESCRIPTION OF THE DRAWINGS

The drawings that are incorporated in this specification and form a part of this specification, illustrate embodiments of the present disclosure, and explain principles of the present disclosure together with the description thereof.

DETAILED DESCRIPTION OF EMBODIMENTS

Figure 1:
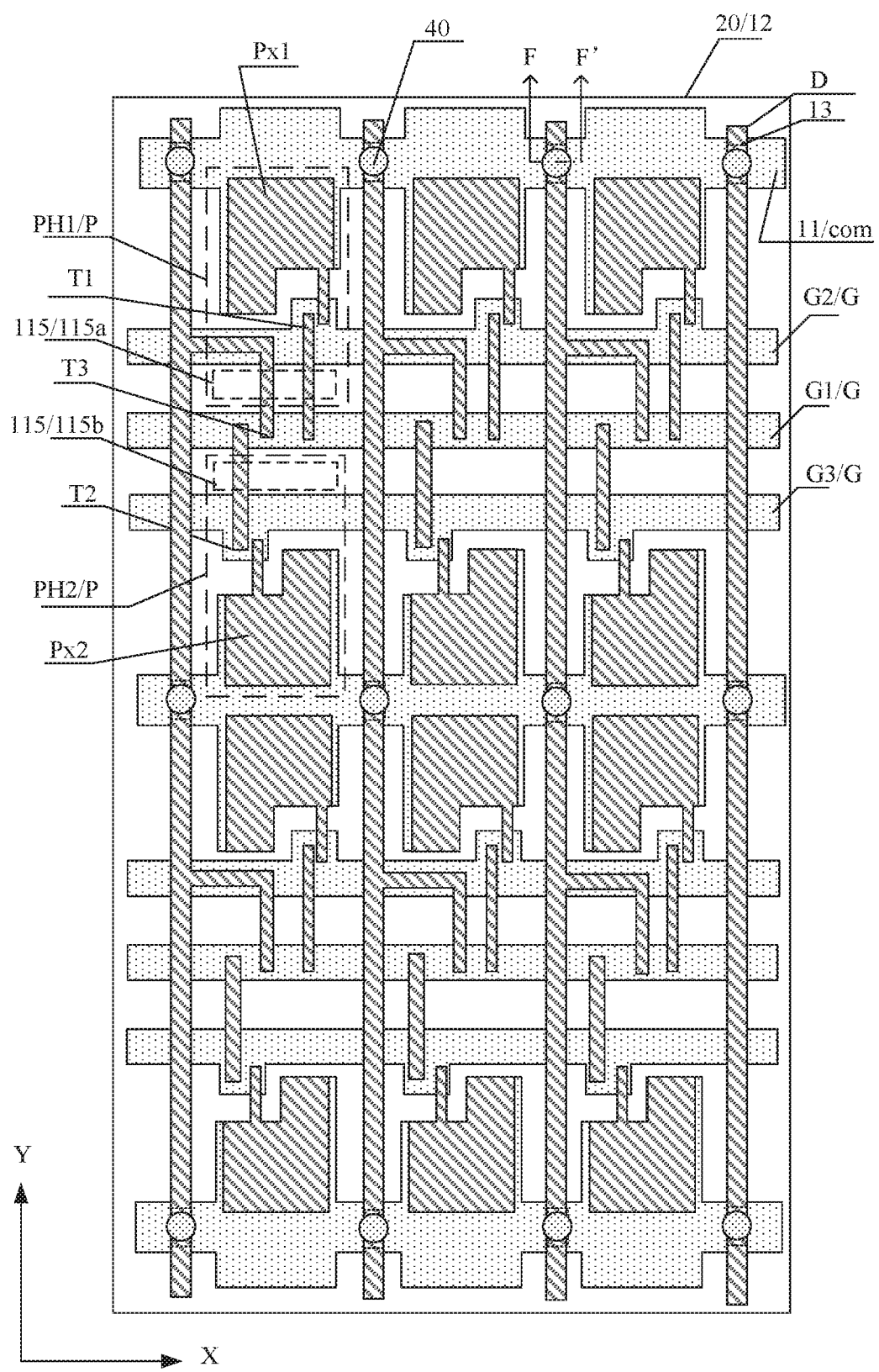
FIG. 1 is a top view of a display panel according to an embodiment of the present disclosure.

Exemplary embodiments of the present disclosure are described below in detail with reference to the drawings. It should be noted that, unless otherwise specified, the relative arrangement of the components and steps, numerical expressions and numerical values set forth in the embodiments are not intended to limit the scope of the present disclosure.

In all examples shown and discussed herein, any specific values should be construed as being merely illustrative instead of limitative. Therefore, different values may be used in other examples of the exemplary embodiments.

It should be noted that similar reference numerals and letters indicate similar items in the drawings. Therefore, once an item is defined in one of the drawings, it is not discussed in the subsequent drawings.

Figure 2:
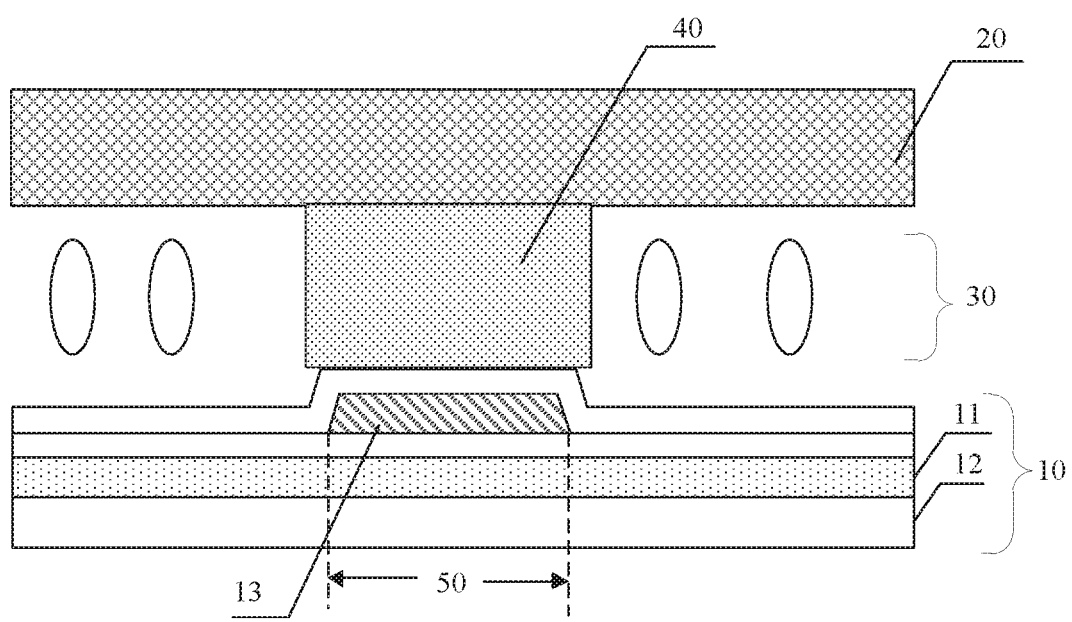
FIG. 2 is a sectional view of the display panel taken along a line F-F' in FIG. 1.

FIG. 1 is a top view of a display panel according to an embodiment of the present disclosure, and FIG. 2 is a sectional view of the display panel taken along a line F-F' in FIG. 1. With reference to FIG. 1 and FIG. 2, the display panel according to the embodiment of the present disclosure includes an array substrate 10 and a color filter substrate 20 opposite to each other.

The array substrate 10 includes multiple sub-pixels P arranged in an array, multiple gate lines G extending in a first direction X, and multiple data lines D extending in a second direction Y. The first direction X is nonparallel with the second direction Y.

The array substrate further includes a common electrode line com. The common electrode line com includes a first wire portion 11 extending in the first direction X.

The first wire portion 11 is located between adjacent sub-pixels P.

Each sub-pixel P includes a first driving region PH1 and a second driving region PH2 arranged in the second direction Y.

The gate line G is located between the first driving region PH1 and the second driving region PH2.

The array substrate 10 includes a base substrate 12.

The data lines D include multiple support sections 13 each located at an intersection of the data line D with the first wire portion 11. An orthographic projection of the support section 13 on the base substrate 12 is a support region 50.

The display panel further includes support pillars 40 located between the array substrate 10 and the color filter substrate 20.

A side of the support pillar 40 close to the array substrate 10 is located in the support region 50.

Still referring to FIG. 1 and FIG. 2, the display panel provided in this embodiment includes the array substrate 10 and the color filter substrate 20. Since the display panel is a liquid crystal display panel, a liquid crystal layer 30 is arranged between the array substrate 10 and the color filter substrate 20. The support pillar 40 is generally formed on the color filter substrate 20, but in some embodiments, the support pillar 40 may be formed on the array substrate 10.

The array substrate 10 includes the multiple sub-pixels P arranged in an array. Each sub-pixel P includes the first driving region PH1 and the second driving region PH2. The first thin film transistor T1 is located in the first driving region PH1, and the second thin film transistor T2 is located in the second driving region PH2. The presence of the first thin film transistor T1 and the second thin film transistor T2 results in a poor flatness at an intersection of the gate line G with the data line D between the first driving region PH1 and the second driving region PH2. If the support pillar 40 is placed at the intersection, the support effect for the display panel is not desired. Multiple gate lines G are arranged between the first driving region PH1 and the second driving region PH2 in the sub-pixel P. In order to electrically insulate different gate lines G with each other and to meet requirement of the manufacturing process, the gate lines G are spaced apart from each other by a certain safety distance. If the distance between the first driving region PH1 and the second driving region PH2 in the sub-pixel P is increased, the area for display in the sub-pixel P from is decreased. Therefore, a length of the gate line G in the second direction Y is better to be not greater than a length of the support pillar 40 in the second direction Y. In another embodiment, the first wire portion 11 is used to provide a common signal for adjacent storage electrodes in the first direction X, and thus only one first wire portion 11 may be arranged between adjacent sub-pixels P. Therefore, a length of the first wire portion 11 in the second direction Y may be greater than the length of the support pillar 40 in the second direction Y. Compared with the gate line G, the first wire portion 11 is more suitable to place the support pillar 40, so as to improve the support stability of the support pillar 40. The data line D includes multiple support sections 13 each located at an intersection of the data line D with the first wire portion 11. A length of the support section 13 in the second direction Y is greater than the length of the support pillar 40 in the second direction Y. If the support pillar 40 is cylindrical, the length of the support pillar 40 in the second direction Y is a diameter of the support pillar 40, and the length of the support pillar 40 in the second direction Y is less than the length of the first wire portion 11 in the second direction Y.

The orthographic projection of the support section 13 on the base substrate 12 is the support region 50, and the side of the support pillar 40 close to the array substrate 10 is located in the support region 50. That is, the side of the support pillar 40 close to the array substrate 10 is located at the intersection of the first wire portion 11 with the data line D, effectively avoiding a change in structures of the first driving region PH1 and the second driving region PH2 in the case of the support pillar 40 being arranged in other regions of the first wire portion 11 in the display panel, thereby effectively improving display quality of the display panel.

Figure 3:
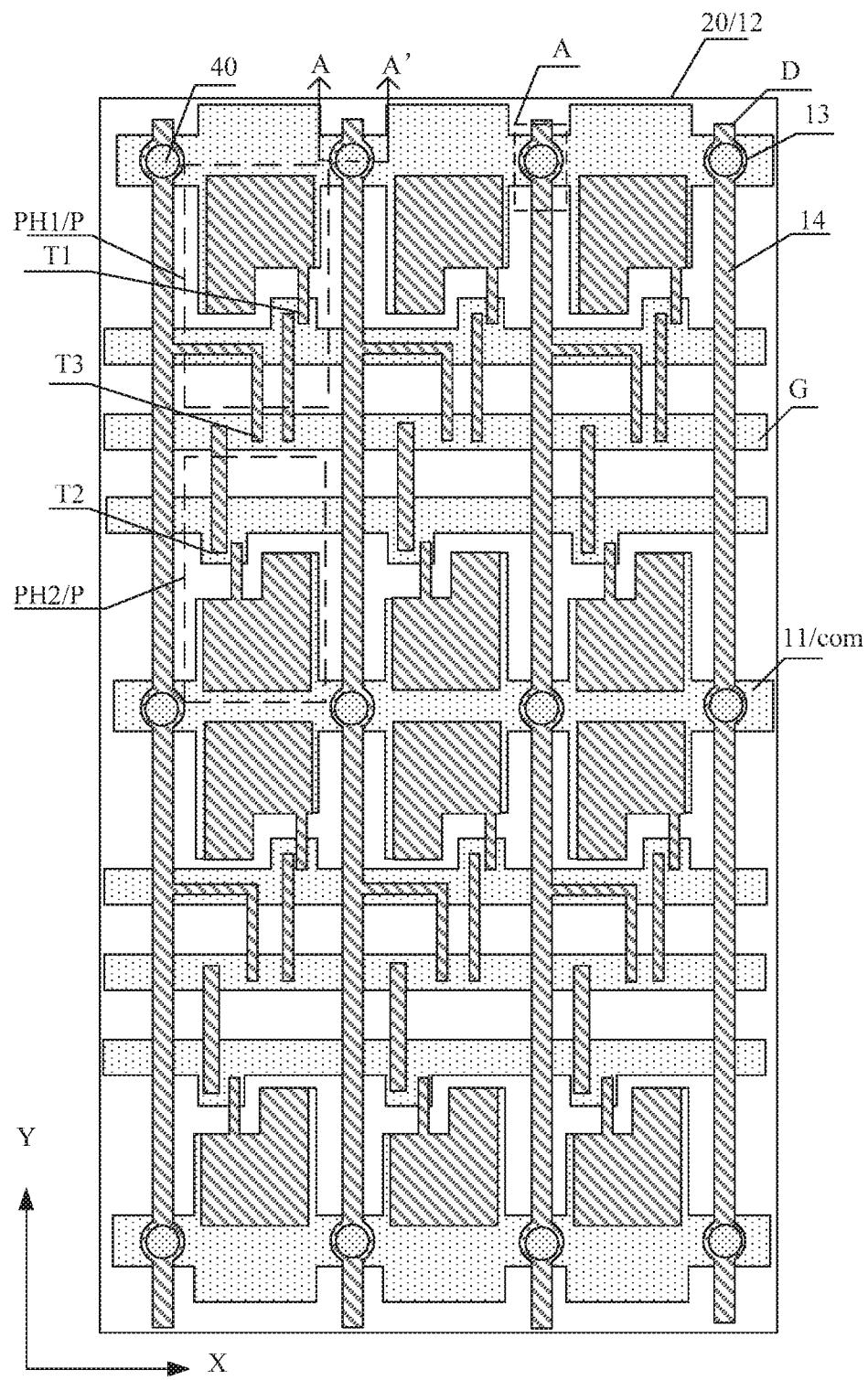
FIG. 3 is a top view of a display panel according to another embodiment of the present disclosure.
Figure 4:
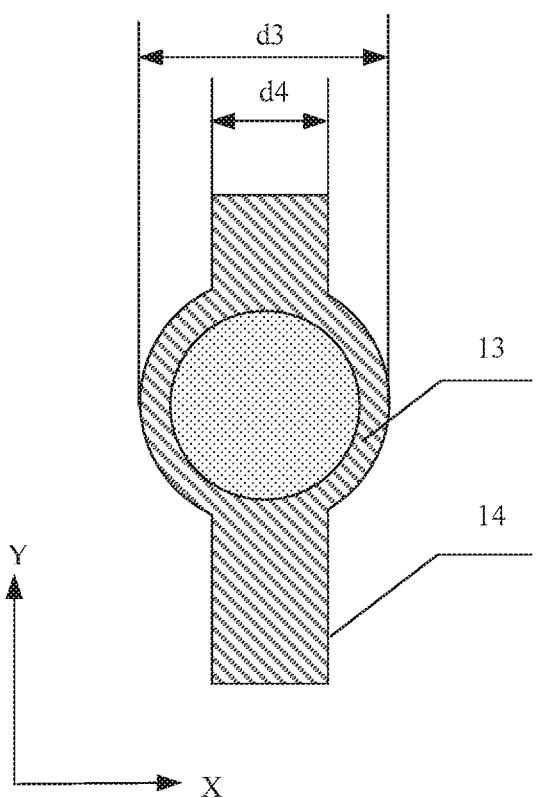
FIG. 4 is an enlarged view of a portion A in FIG. 3.
Figure 5:
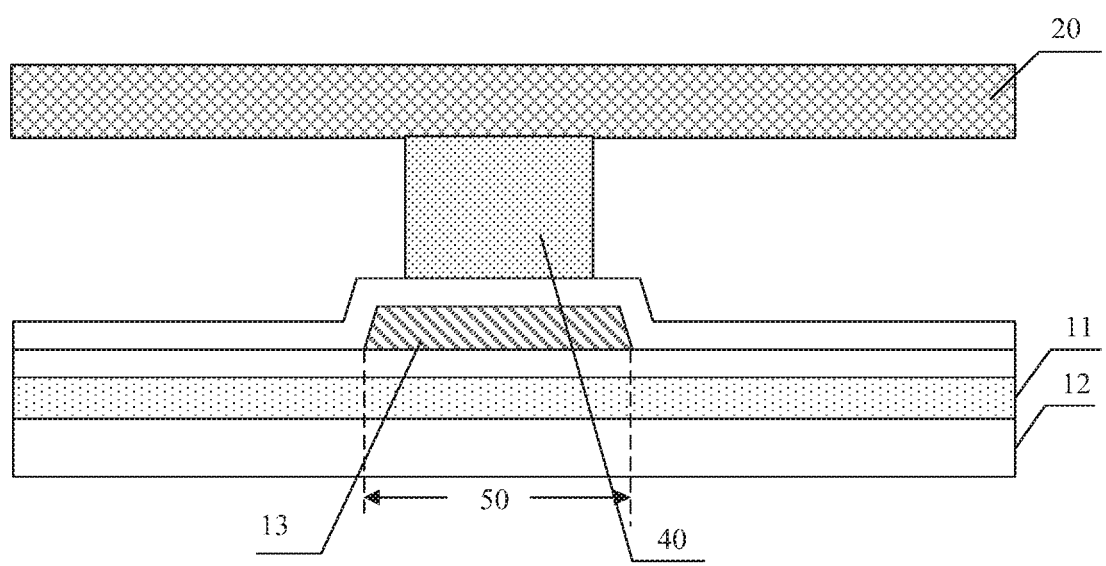
FIG. 5 is a sectional view of the display panel taken along a line A-A' in FIG. 3.

FIG. 3 is a top view of a display panel according to another embodiment of the present disclosure, FIG. 4 is an enlarged view of a portion A in FIG. 3, and FIG. 5 is a sectional view of the display panel taken along a line A-A' in FIG. 3. With reference to FIGS. 3 to 5, the data line D further includes a normal section 14 located between adjacent support sections 13.

A length of the support section 13 in the first direction X is greater than a length of the normal section 14 in the first direction X.

Still referring to FIGS. 3 to 5, the data line D includes the support section 13 and the normal section 14. The support section 13 is located at the intersection of the data line D with the first wire section 11, and the data line D extends in the second direction Y. The normal section 14 is between adjacent support sections 13 on the data line D.

The length of the support section 13 in the first direction X is indicated by d3, and the length of the normal section 14 in the first direction X is indicated by d4, where d3>d4>0. The length of the normal section 14 in the first direction X is a normal length of a data line in the first direction X in the conventional technology, which is less than the length of the support pillar 40 in the first direction X. If the length of the support section 13 in the first direction X is the same as the length of the normal section 14 in the first direction X, the side of the support pillar 40 close to the array substrate is partially located outside the support region 50, resulting in that the side of the support pillar 40 close to the array substrate may not be completely attached to the array substrate. In the embodiment of the present disclosure, by setting the length of the support section 13 in the first direction X to be greater than the length of the normal section 14 in the first direction X, the side of the support pillar 40 close to the array substrate can be completely located in the support region 50, thereby further improving the support stability of the support pillar 40 and improving the display quality of the display panel.

By setting the length of the support section 13 in the first direction X to be greater than the length of the normal section 14 in the first direction X, not the length of the whole data line D in the first direction X is required to be increased, thereby not affecting a capacitance of a storage capacitor in the sub-pixel P and an aperture ratio of the sub-pixel P.

Figure 6:
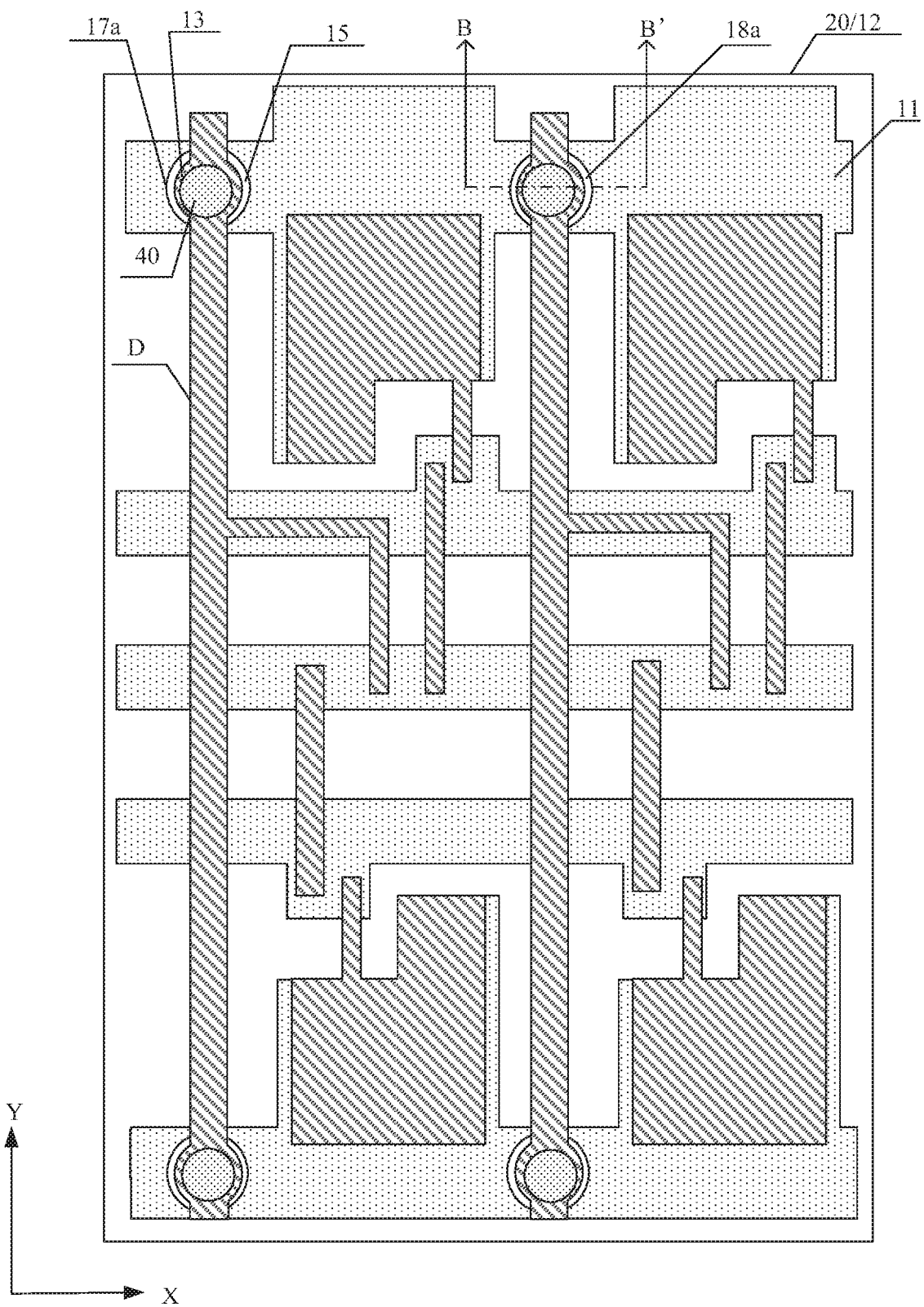
FIG. 6 is a top view of a display panel according to another embodiment of the present disclosure.
Figure 7:
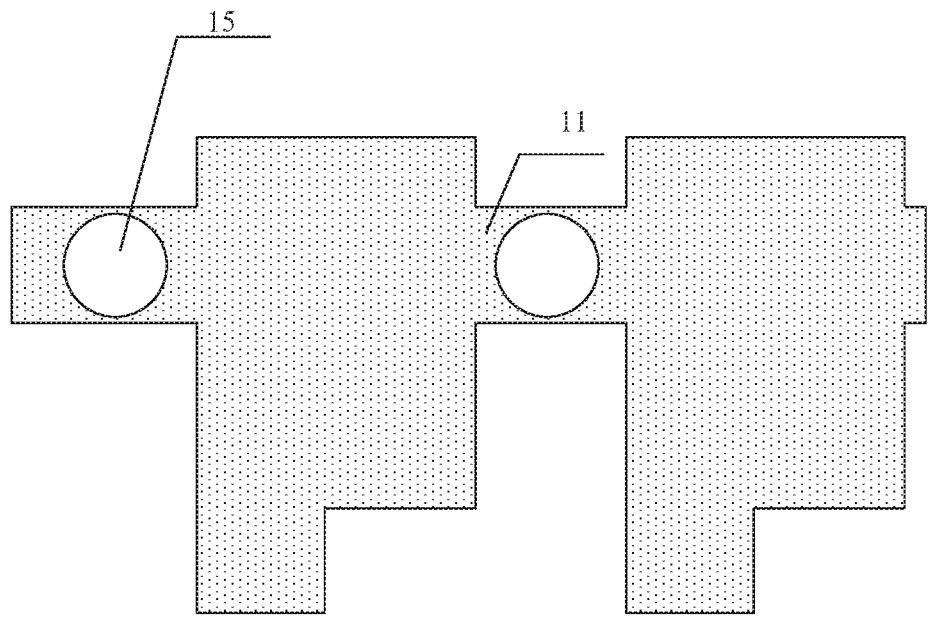
FIG. 7 is a top view of a wire portion according to an embodiment of the present disclosure.
Figure 8:
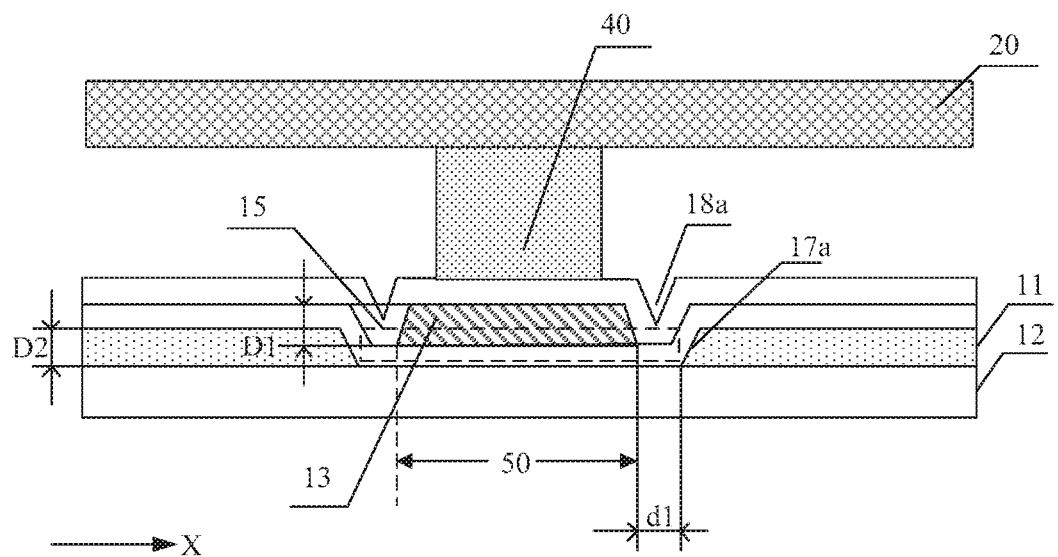
FIG. 8 is a sectional view of the display panel taken along a line B-B' in FIG. 6.

FIG. 6 is a top view of a display panel according to another embodiment of the present disclosure, FIG. 7 is a top view of a wire portion according to an embodiment of the present disclosure, and FIG. 8 is a sectional view of the display panel taken along a line B-B' in FIG. 6. With reference to FIGS. 6 to 8, the first wire portion 11 includes a first hollow portion 15 located at an intersection of the first wire portion 11 with the data line D.

An orthographic projection of the first hollow portion 15 on the base substrate 12 completely covers the support region 50.

Still referring to FIGS. 6 to 8, the first hollow portion 15 is arranged at the intersection of the first wire portion 11 with the data line D. The side of the support pillar 40 close to the array substrate is completely located in the support region 50, and the orthographic projection of the first hollow portion 15 on the base substrate 12 completely covers the support region 50. That is, the orthographic projection of the support pillar 40 on the base substrate 12 is completely in the orthographic projection of the first hollow portion 15 on the base substrate 12, so that the thickness of the array substrate at a region where the support region 50 is located is reduced, effectively reducing a difference between the thickness of the array substrate at the support region 50 and the thickness of the array substrate at a region around the support region 50, improving the flatness, and facilitating the arrangement of the support pillar 40.

Figure 9:
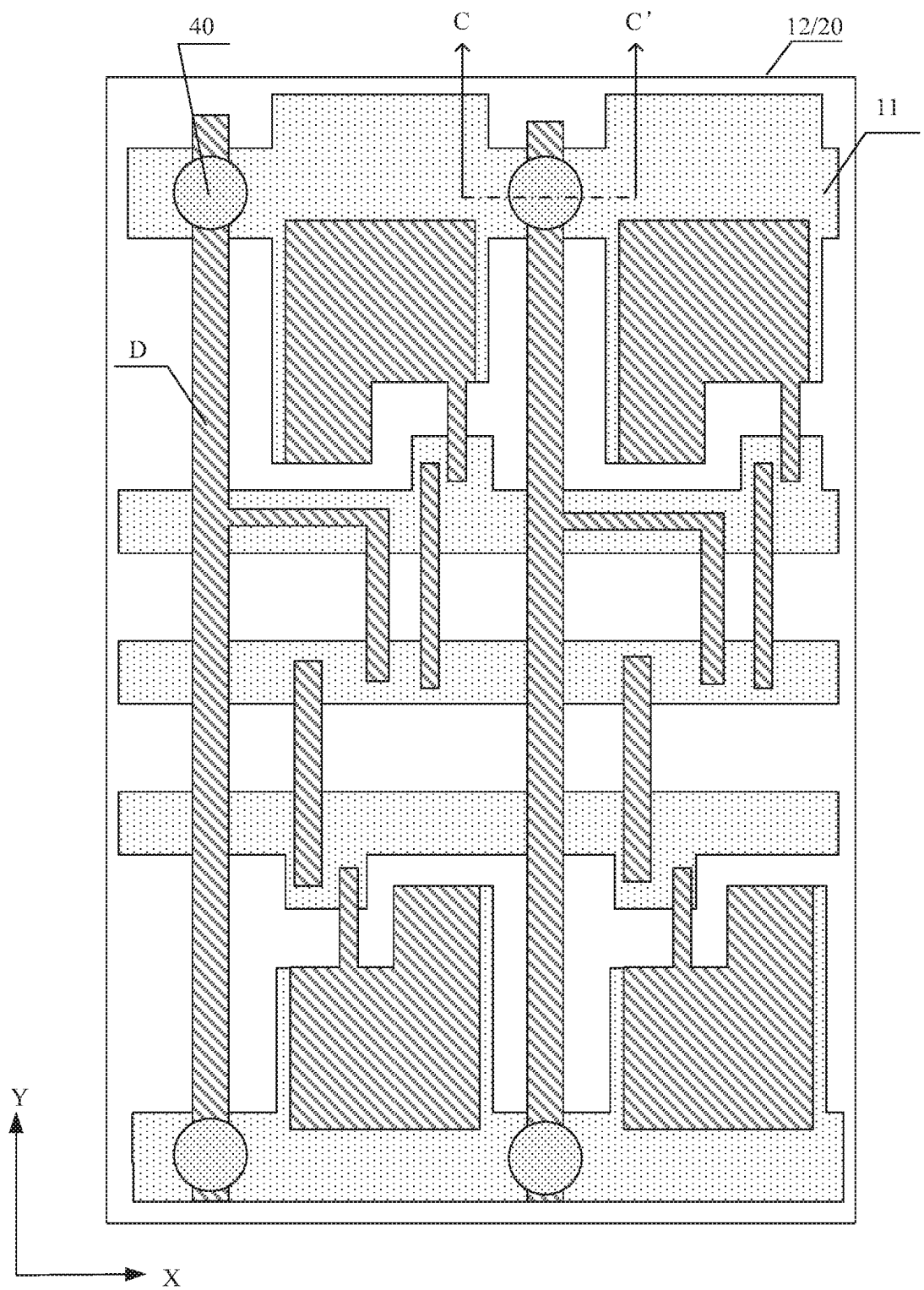
FIG. 9 is a top view of a display panel according to another embodiment of the present disclosure.
Figure 10:
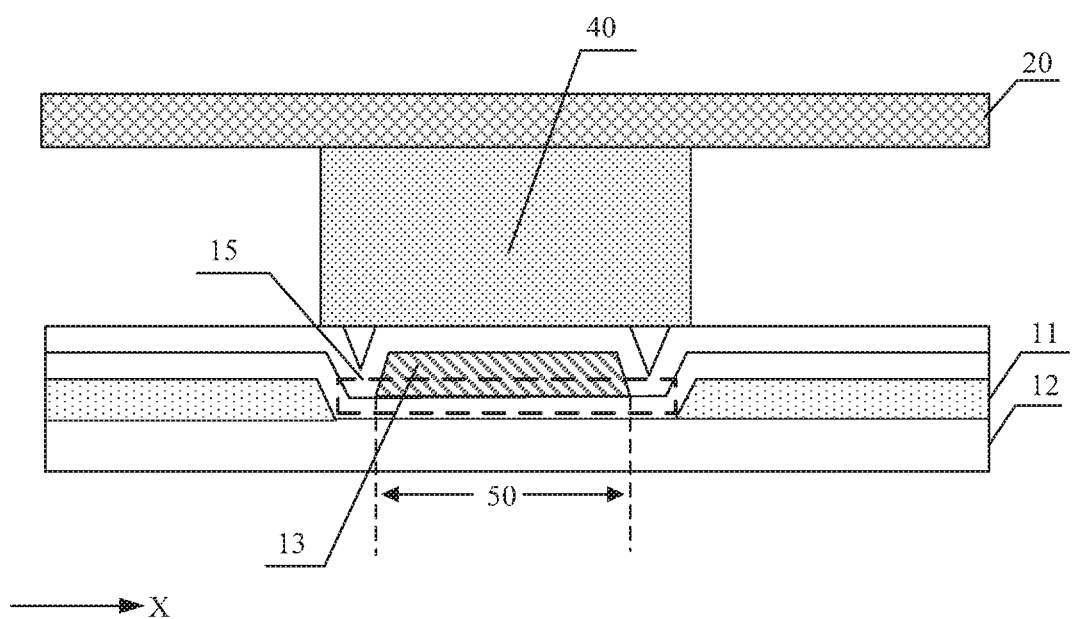
FIG. 10 is a sectional view of the display panel taken along a line C-C' in FIG. 9.

FIG. 9 is a top view of a display panel according to another embodiment of the present disclosure, and FIG. 10 is a sectional view of the display panel taken along a line C-C' in FIG. 9. With reference to FIG. 9 and FIG. 10, a first hollow portion 15 is arranged at the intersection of the first wire portion 11 with the data line D, and the support region 50 is in a region where the first hollow portion 15 in the first wire portion 11 is located, so that the thickness of the array substrate at a region where the support region 50 is located is reduced, effectively reducing a difference between the thickness of the array substrate at the support region 50 and the thickness of the array substrate at a region around the support region 50, improving the flatness, and facilitating the arrangement of the support pillar 40.

Figure 11:
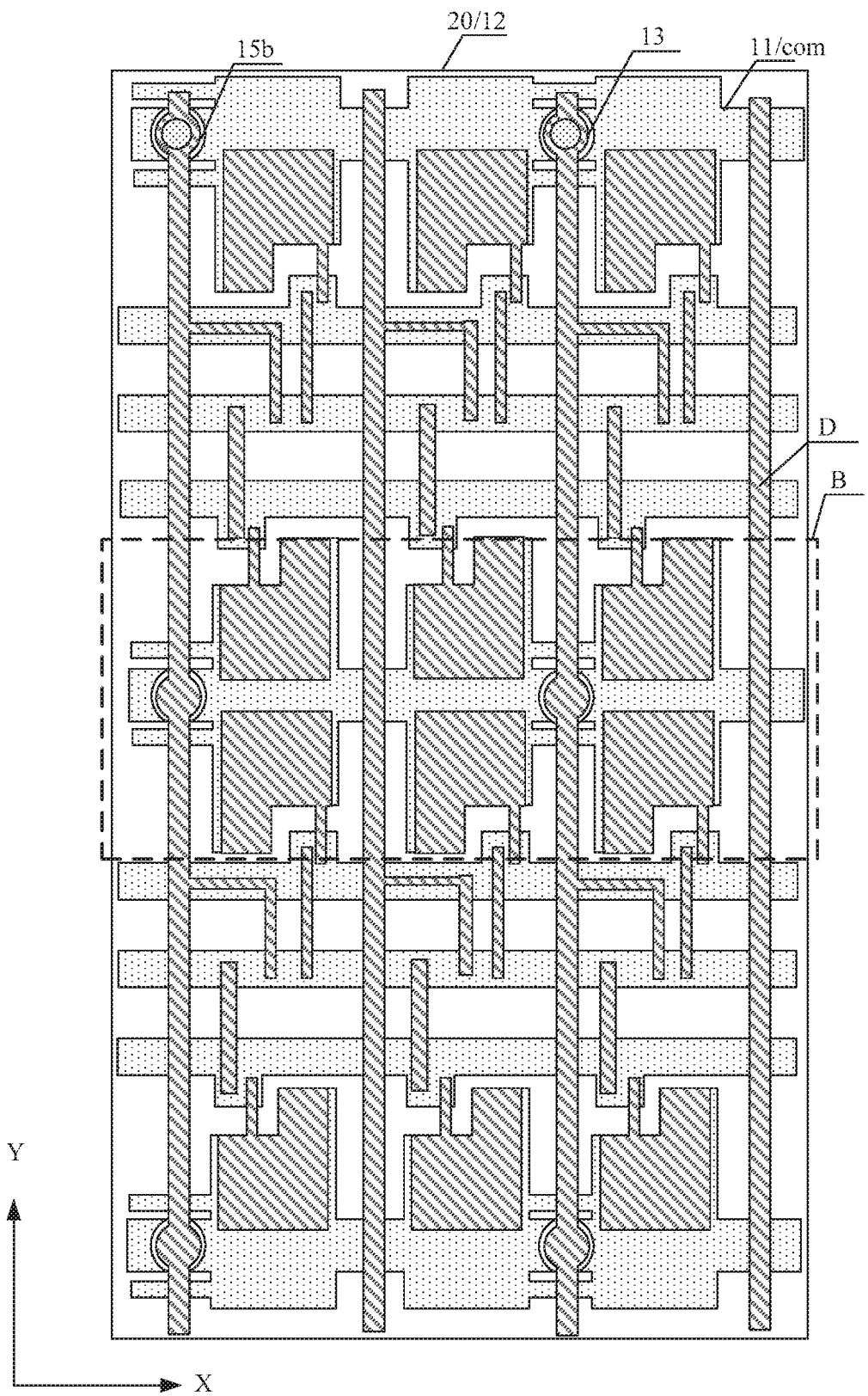
FIG. 11 is a top view of a display panel according to another embodiment of the present disclosure.
Figure 12:
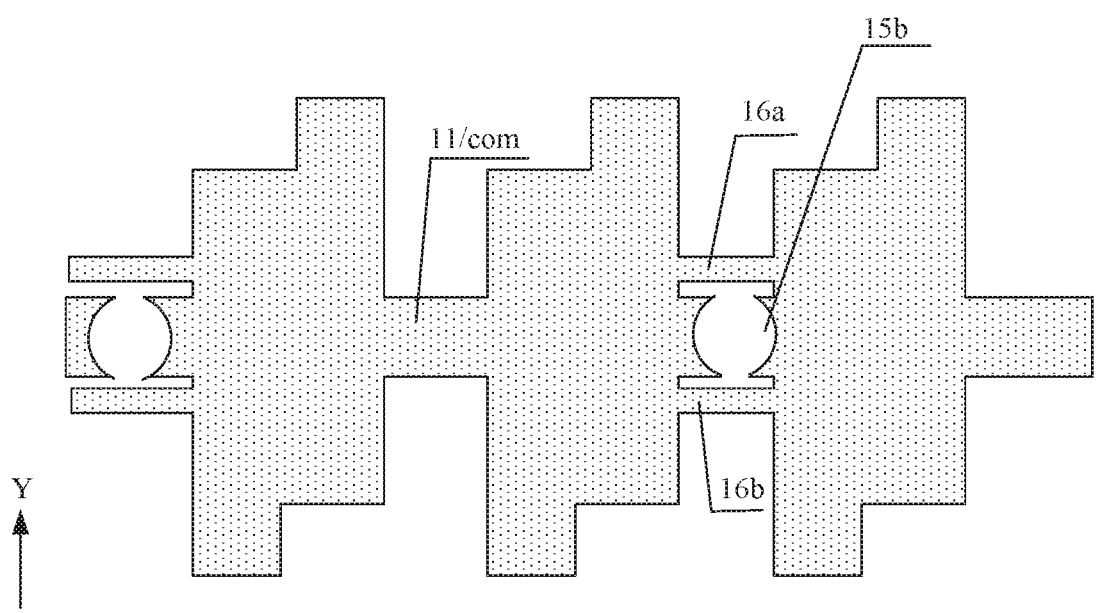
FIG. 12 is a top view of a wire portion at a portion B in FIG. 11.

FIG. 11 is a top view of a display panel according to another embodiment of the present disclosure, and FIG. 12 is a top view of a wire portion at a portion B in FIG. 11. With reference to FIG. 8, FIG. 11 and FIG. 12, the first wire portion 11 is divided by a first hollow portion 15*b*.

The common electrode line com further includes a second wire portion 16*a* and a third wire portion 16*b*. The second wire portion 16*a* and the third wire portion 16*b* are respectively arranged on two opposite sides of the first hollow portion 15*b* in the second direction Y.

Still referring to FIG. 8, FIG. 11 and FIG. 12, due to the first hollow portion 15*b*, transmission of the electrical signal through the first wire portion 11 is affected. Therefore, the common electrode line com further includes the second wire portion 16*a* and the third wire portion 16*b*, to solve the above problem. With the second wire portion 16*a* and the third wire portion 16*b* which are opposite to each other in the second direction Y, the first wire portion 11 is allowed to be divided by the first hollow portion 15*b*, that is, the first wire portion 11 may be disconnected by the first hollow portion 15*b*, which reduces the difficulty in producing the first hollow portion 15*b* on the first wire portion 11.

Figure 13:
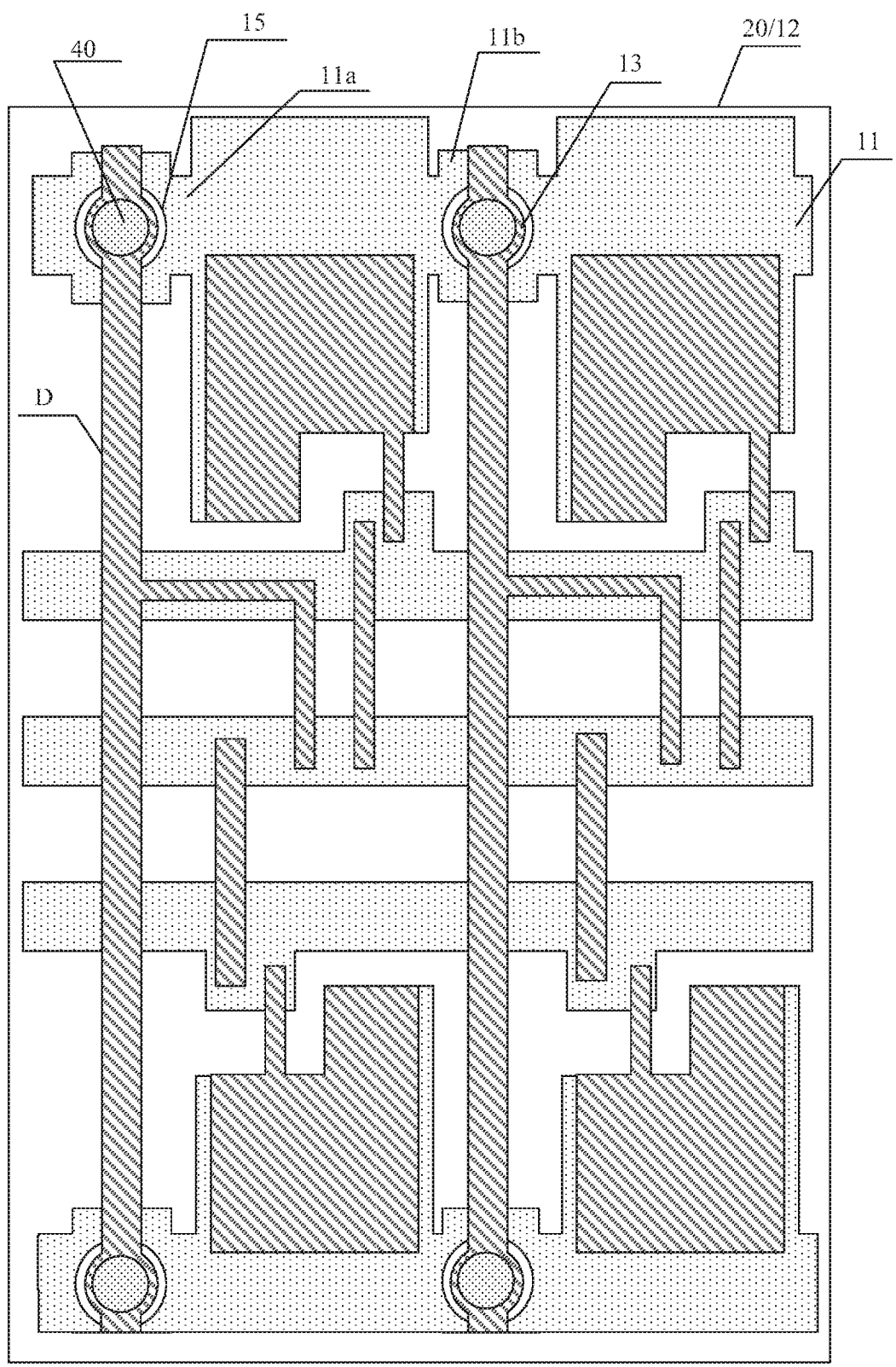
FIG. 13 is a top view of a display panel according to another embodiment of the present disclosure.
Figure 14:
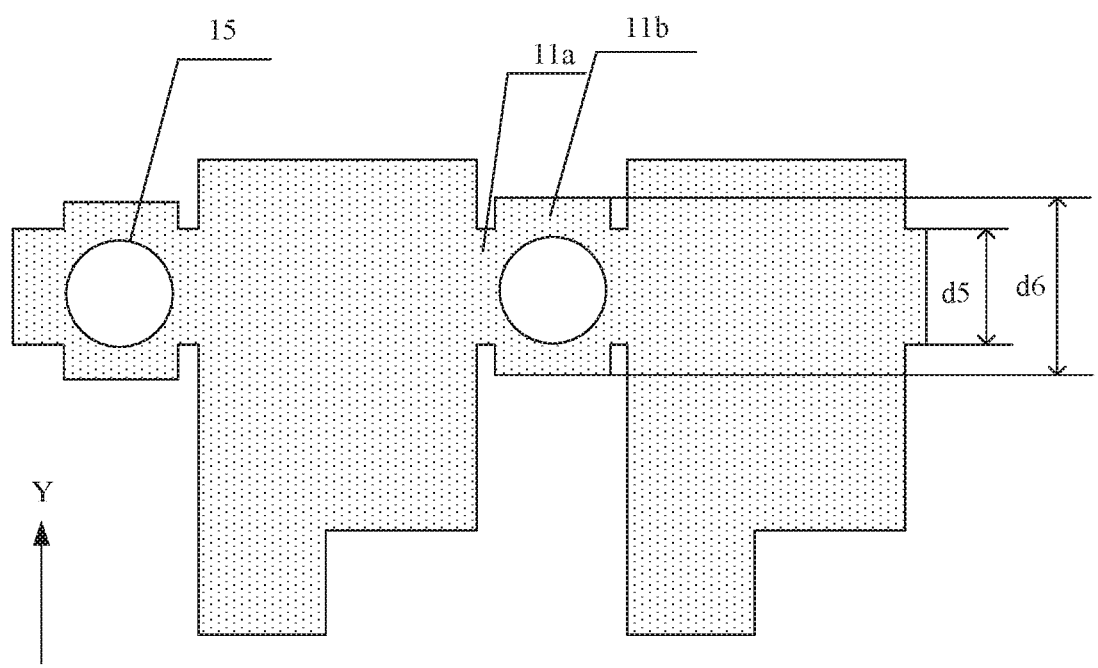
FIG. 14 is a top view of a wire portion according to another embodiment of the present disclosure.

FIG. 13 is a top view of a display panel according to another embodiment of the present disclosure, and FIG. 14 is a top view of a wire portion according to another embodiment of the present disclosure. With reference to FIG. 8, FIG. 13, and FIG. 14, the first wire portion 11 includes a normal wire section 11*a* and a widened wire section 11*b*. The widened wire section 11*b* intersects the data line D.

A length of the first wire portion 11 in the second direction Y is a width of the first wire portion 11.

The width of the widened wire section 11*b* is greater than the width of the normal wire section 11*a*.

Still referring to FIG. 8, FIG. 13 and FIG. 14, the first wire portion 11 includes the normal wire section 11a and the widened wire section 11b. The widened wire section 11b intersects the data line D. That is, the first hollow portion 15 is arranged on the widened wire section 11b.

The length of the first wire portion 11 in the second direction Y is the width of the first wire portion 11. The width of the normal wire section 11a is indicated by d5, and the width of the widened wire section 11b is indicated by d6, where d6>d5>0. In the embodiment of the present disclosure, by arranging the widened wire section 11b and configuring the width of the widened wire section 11b to be greater than the width of the normal wire section 11a, the transmission of the electrical signal through the first wire portion 11 is not affected by the first hollow portion 15 arranged on the widened wire section 11b.

With reference to FIG. 6 and FIG. 8, the first wire portion 11 includes a first edge 17a. The first edge 17a is adjacent to the support region 50.

The array substrate further includes a first trench 18a The first trench 18 is located between the support region 50 and the first edge 17a adjacent to the support region 50.

Since the first wire portion 11 includes a first hollow portion 15, the first wire portion 11 includes a first edge 17a which is adjacent to the support region 50. The first trench 18a is arranged between the support region 50 and the first edge 17a adjacent to the support region 50. The first trench 18a surrounds a part of the support region 50. The side of the support pillar 40 close to the array substrate is completely located in the support region 50. With the first trench 18a, the support pillar 40 can be effectively prevented from sliding, thereby effectively improving the support stability of the support pillar 40, and improving the display quality of the display panel.

With reference to FIG. 8, in the first direction X, a shortest distance between the first edge 17a and the support section 13 adjacent to the first edge is indicated by d1, where 1 μm≤d1≤3 μm.

The array substrate further includes multiple insulating layers. Due to the existence of the insulating layers, the first trench 18a may not be formed in the array substrate in a case that the shortest distance between the first edge 17a and the support section 13 adjacent to the first edge 17a is less than 1 μm. The first hollow portion 15 is excessively large in a case that the shortest distance between the first edge 17a and the support section 13 adjacent to the first edge 17a is greater than 3 μm, which increases the difficulty of designing the first wire portion 11.

It should be noted that FIG. 8 illustrates that the shortest distance between the first edge 17a and the support section 13 adjacent to the first edge is in a range of 1 μm to 31 μm in the first direction X as an example, but the shortest distance in another direction may be in the range.

With reference to FIG. 8, a thickness of the support section 13 is indicated by D1, and a thickness of the first wire portion 11 is indicated by D2, where |D1−D2|<0.1 μm, D1>0, and D2>0.

The difference between the thickness of the support section 13 and the thickness of the first wire portion 11 is less than 0.1 m. That is, the thickness of the support section 13 and the thickness of the first wire portion 11 are nearly the same, so that the thickness of the array substrate at the support region 50 is the same as the thickness of the array substrate at two sides of the support region 50 in the first direction X, which prevents that only a part of the side of the support pillar 40 close to the array substrate is attached to the array substrate in a case that the array substrate is not well aligned with the color filter substrate. With the embodiment of the present disclosure, the side of the support pillar 40 close to the array substrate can be completely attached to the array substrate, thereby effectively improving the support stability of the support pillar, and improving the display quality of the display panel.

Figure 15:
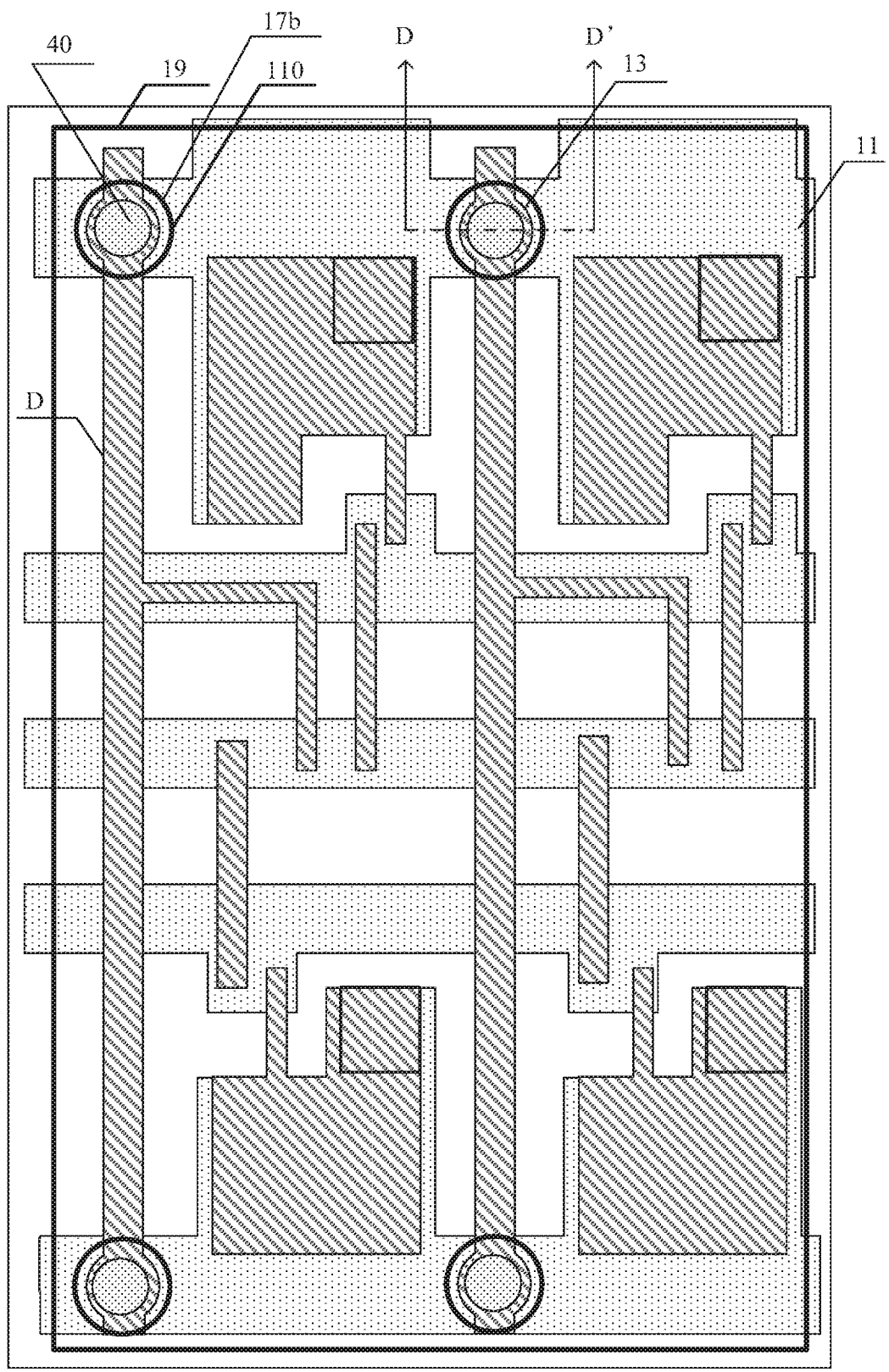
FIG. 15 is a top view of a display panel according to another embodiment of the present disclosure.
Figure 16:
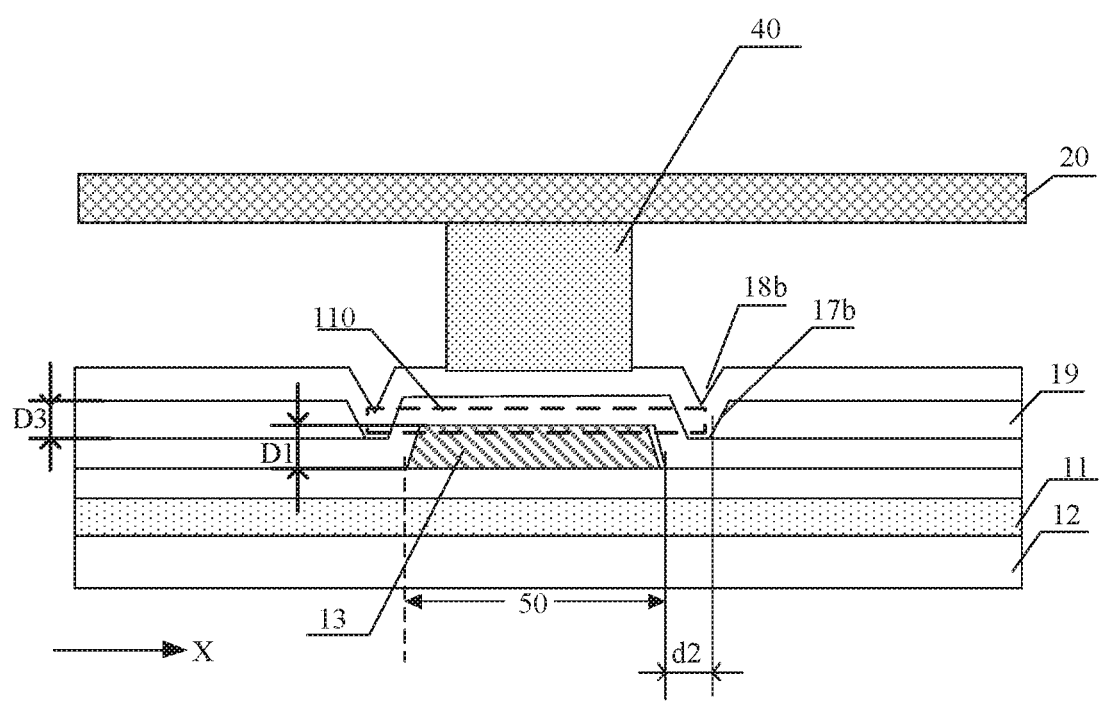
FIG. 16 is a sectional view of the display panel taken along a line D-D' in FIG. 15.

FIG. 15 is a top view of a display panel according to another embodiment of the present disclosure, and FIG. 16 is a sectional view of the display panel taken along a line D-D' in FIG. 15. With reference to FIG. 15 and FIG. 16, the array substrate further includes an electrode layer 19.

The electrode layer 19 includes a second hollow portion 110. An orthographic projection of the second hollow portion 110 on the base substrate 12 completely covers the support region 50.

With reference to FIG. 15 and FIG. 16, the array substrate further includes an electrode layer 19 for forming a storage capacitor with the pixel electrode. The electrode layer 19 includes a second hollow portion 110. The orthographic projection of the second hollow portion 110 on the base substrate 12 completely covers the support region 50. That is, the orthographic projection of the support pillar 40 on the base substrate 12 is in the orthographic projection of the second hollow portion 110 on the base substrate 12, so that the thickness of the array substrate at the region where the support region 50 is located is reduced, effectively reducing the difference between the thickness of the array substrate at the support region 50 and the thickness of the array substrate at two sides of the support region 50 in the first direction X, improving the flatness, and facilitating the arrangement of the support pillar 40.

Figure 17:
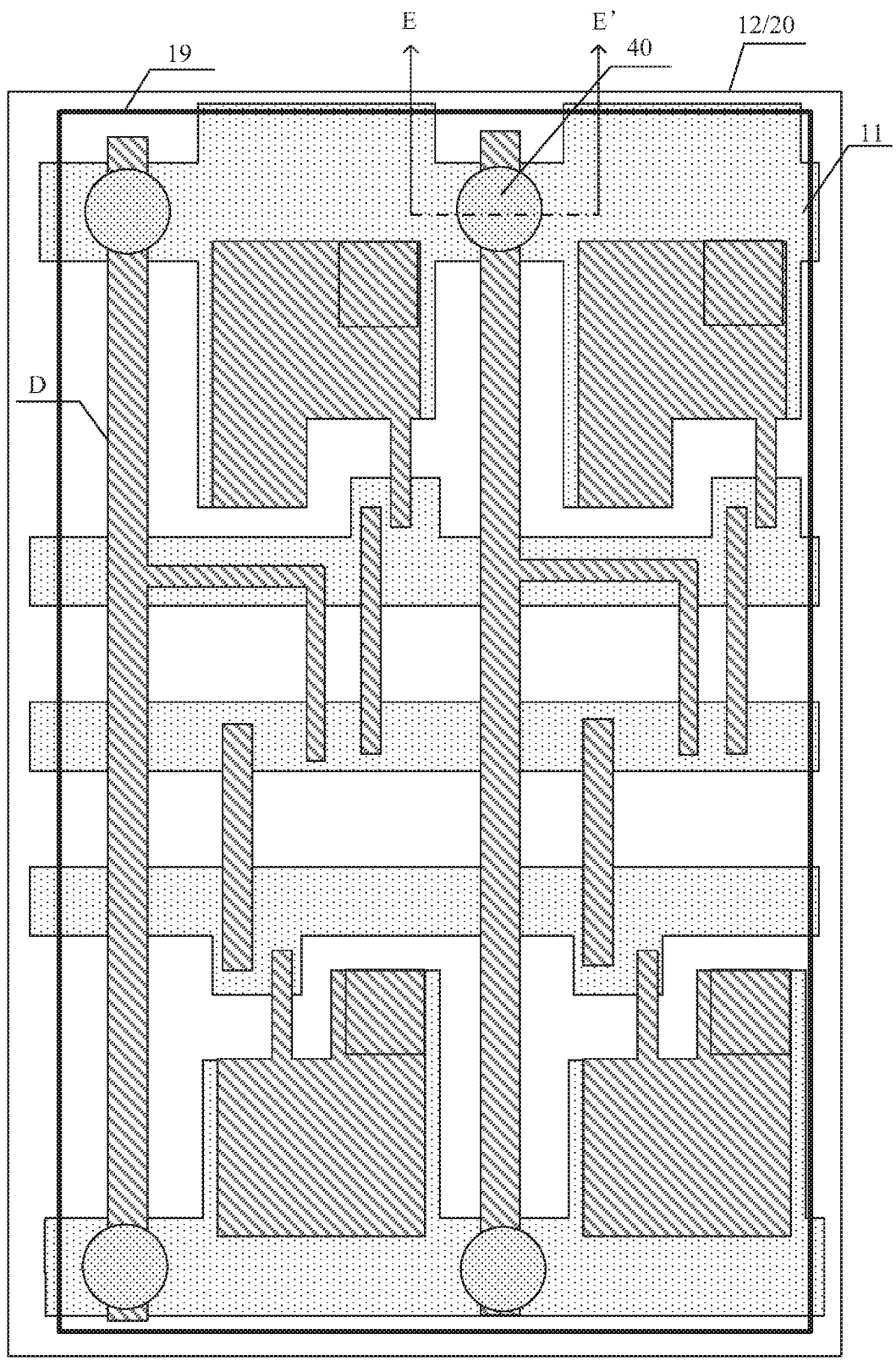
FIG. 17 is a top view of a display panel according to another embodiment of the present disclosure.
Figure 18:
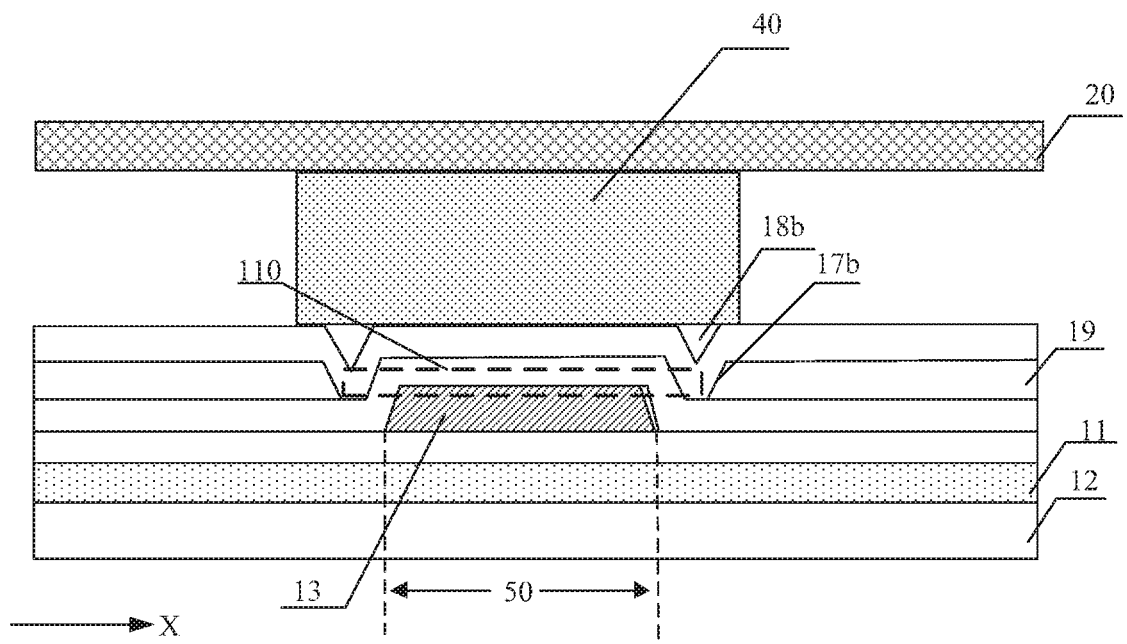
FIG. 18 is a sectional view of the display panel taken along a line E-E' in FIG. 17.

FIG. 17 is a top view of a display panel according to another embodiment of the present disclosure, and FIG. 18 is a sectional view of the display panel taken along a line E-E' in FIG. 17. With reference to FIG. 17 and FIG. 18, the electrode layer 19 includes a second hollow portion 110. The support region 50 is in a region where the second hollow portion 110 in the electrode layer 19 is located, so that the thickness of the array substrate at the region where the support region 50 is located is reduced, effectively reducing the difference between the thickness of the array substrate at the support region 50 and the thicknesses of the array substrates at two sides of the support region 50 in the first direction X, improving the flatness, and facilitating the arrangement of the support pillar 40.

With reference to FIG. 15 and FIG. 16, the electrode layer 19 includes a second edge 17b. The second edge 17b is recessed towards the inside of the electrode layer 19 to form the second hollow portion 110.

The array substrate further includes a second trench 18b that surrounds a part of the support region 50. The second trench 18b is located between the support region 50 and the second edge 17b adjacent to the support region 50.

The second edge 17b is recessed towards the inside of the electrode layer 19 to form the second hollow portion 110. The second trench 18b is arranged between the support region 50 and the second edge 17b adjacent to the support region 50. The second trench 18b surrounds a part of the support region 50. The side of the support pillar 40 close to the array substrate is completely located in the support region 50. With the second trench 18b, the support pillar 40 can be effectively prevented from sliding, thereby effectively improving the support stability of the support pillar 40, and improving the display quality of the display panel.

With reference to FIG. 15 and FIG. 16, in the first direction X, a shortest distance between the second edge 17b and the support section 13 adjacent to the second edge is indicated by d2; where 1 µm≤d2≤3 µm.

The array substrate further includes multiple insulating layers. Due to the existence it of the insulating layers, the second trench 18b may not be formed in the array substrate in a case that the shortest distance between the second edge 17b and the support section 13 adjacent to the second edge 17b is less than 1 µm. The second hollow portion 110 is excessively large in a case that the shortest distance between the second edge 17b and the support section 13 adjacent to the second edge 17b is greater than 3 µm, which affects the structural design of other film layers in the display panel.

It should be noted that FIG. 16 illustrates that the shortest distance between the second edge 17b and the support section 13 adjacent to the second edge is in a range of 1 µm to 31 µm in the first direction X as an example, but the shortest distance in another direction may be in the range.

With reference to FIG. 15 and FIG. 16, a thickness of the support section 13 is indicated by D1, and a thickness of the electrode layer 19 is indicated by D3, where |D1−D3|<0.1 µm. D1>0, and D3>0.

The difference between the thickness of the support section 13 and the thickness of the electrode layer 19 is less than 0.1 µm. That is, the thickness of the support section 13 and the thickness of the electrode layer 19 are nearly the same, so that the thickness of the array substrate at the support section 50 is the same as the thickness of the array substrate at two sides of the support region 50 in the first direction X, which prevents that only a part of the side of the support pillar 40 close to the array substrate is attached to the array substrate in a case that the array substrate is not well aligned with the color filter substrate. With the embodiment of the present disclosure, the side of the support pillar 40 close to the array substrate can be completely attached to the array substrate, thereby effectively improving the support stability of the support pillar, and improving the display quality of the display panel.

Figure 19:
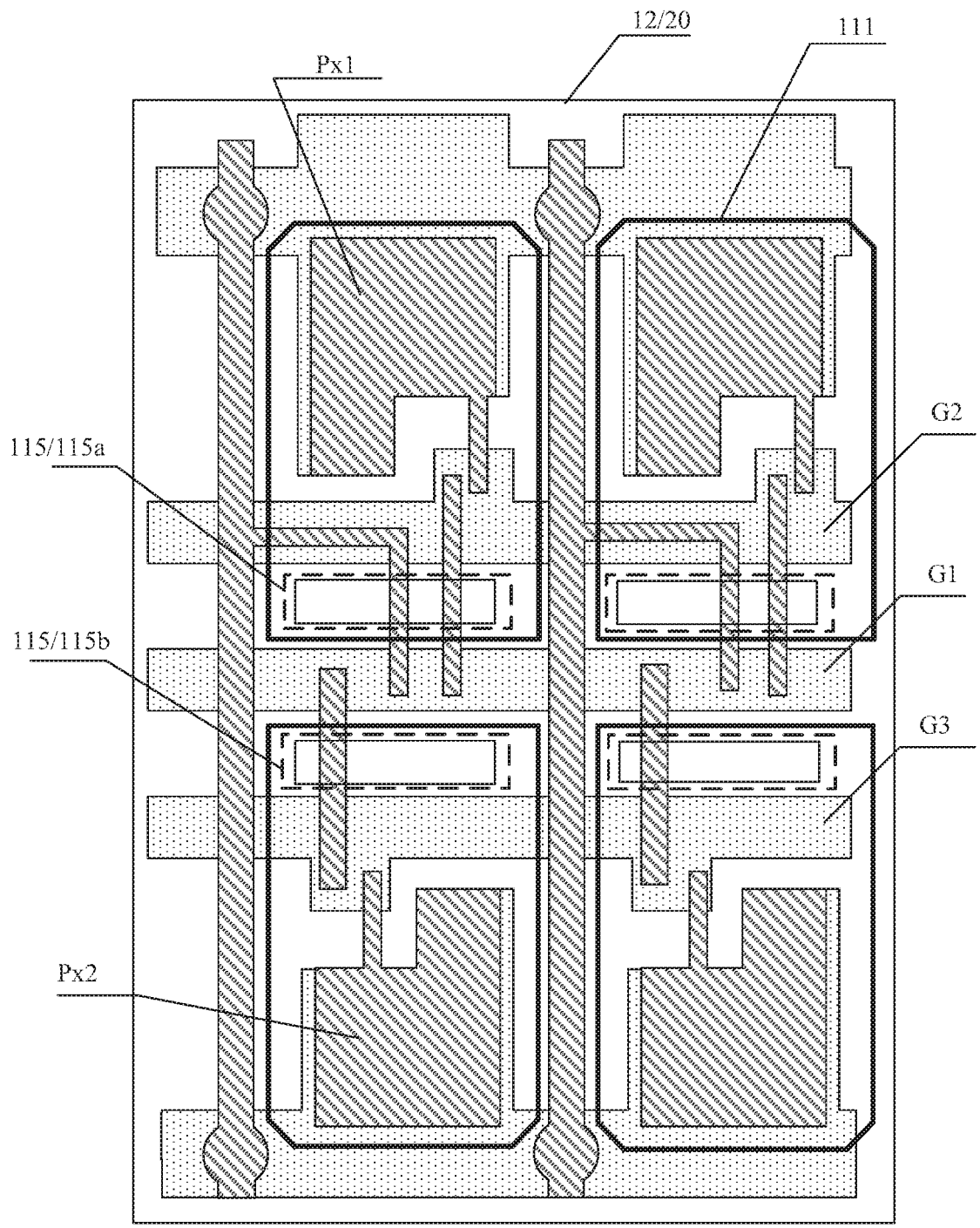
FIG. 19 is a top view of a display panel according to another embodiment of the present disclosure.
Figure 20:
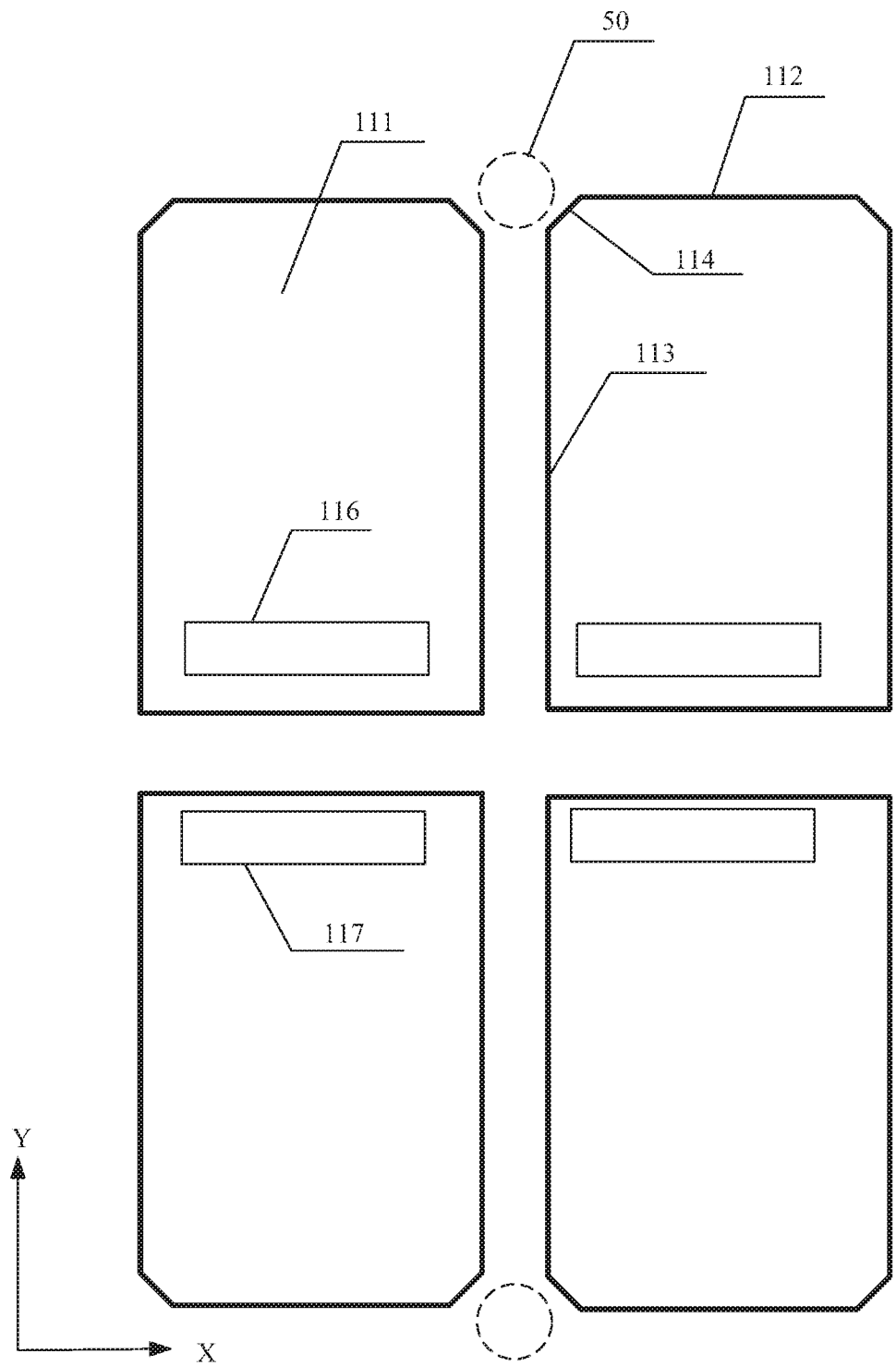
FIG. 20 is a top view of a metal reflective layer according to an embodiment of the present disclosure.

FIG. 19 is a top view of a display panel according to another embodiment of the present disclosure, and FIG. 20 is a top view of a metal reflective layer according to an embodiment of the present disclosure. With reference to FIG. 19 and FIG. 20, the array substrate further includes a metal reflective layer 111.

The metal reflective layer 111 includes a first side 112, a second side 113 and a third side 114. The first side 112 extends in the first direction X. and the second side 113 extends in the second direction Y.

The third side 114 intersects both the first side 112 and the second side 113, and is adjacent to the support region 50. The metal reflective layer 111 is generally rectangular, but in the embodiment of the present disclosure, a chamfering process is performed on a corner close to the support region 50 to form the third side 114, thereby improving the flatness of the film layer around the support pillar.

With reference to FIG. 19 and FIG. 20, the display panel further includes the metal reflective layer 111 located on the array substrate, for reflecting external light. The metal reflective layer 111 includes the third side 114 which is adjacent to the support region 50. The side of the support pillar (which is not shown in FIG. 19 and FIG. 20) close to the array substrate 10 is completely located in the support region 50, and the third side 114 is away from the support pillar arranged in the support region 50.

With reference to FIG. 3 and FIG. 19, the sub-pixel P further includes a first thin film transistor T1 and a second thin film transistor T2. The first thin film transistor T1 is located at a side of the first driving region PH1 close to the second driving region PH2. The second thin film transistor T2 is located at a side of the second driving region PH2 close to the first driving region PH1. The sub-pixel P further includes a main thin film transistor T3, a first pixel electrode Px1 located in the first driving region PH1, and a second pixel electrode Px2 located in the second driving region PH2.

The gate lines G include a main gate line G1, a first gate line G2 and a second gate line G3.

A source of the main thin film transistor T3 is connected to the data line D, a first drain of the main thin film transistor T3 is connected to a source of the first thin film transistor T1, a gate of the main thin film transistor T3 is connected to the main gate line G1, and a second drain of the main thin film transistor T3 is connected to a source of the second thin film transistor T2. A drain of the first thin film transistor T1 is connected to the first pixel electrode Px1, and a gate of the first thin film transistor T1 is connected to the first gate line G2. A drain of the second thin film transistor T2 is connected to the second pixel electrode Px2, and a gate of the second thin film transistor T2 is connected to the second gate line G3.

The first pixel electrode Px1 is driven by the main thin film transistor T3 and the first thin film transistor T1 in response to signals from the main gate line G1 and the first gate line G2, and the second pixel electrode Px2 is driven by the main thin film transistor T3 and the second thin film transistor T2 in response to signals from the main gate line G1 and the second gate line G3. A potential difference is formed between the pixel electrode and the common electrode in response to a signal from the data line D, to drive a state of liquid crystal molecules in the liquid crystal layer to change. In this state, external light incident from the color filter substrate is incident on the metal reflective layer of the array substrate via the liquid crystal layer, and is reflected to the liquid crystal layer via the metal reflective layer, so as to display an image according to angles of the liquid crystal molecules in the liquid crystal layer.

With reference to FIG. 3 and FIG. 19, the display panel further includes at least one light-transmissive region 115.

The display panel further includes at least one light-transmissive region 115. When the external light source is weak, the display panel may display by using a backlight source.

With reference to FIG. 3 and FIG. 19, the at least one light-transmissive region 115 each includes a first light-transmissive region 115a and a second light-transmissive region 115b.

The first driving region PH1 includes the first light-transmissive region 115a, and the first light-transmissive region 115a is located between the main gate line G1 and the first gate line G2.

The second driving region PH2 includes the second light-transmissive region 115b, and the second light-transmissive region 115b is located between the main gate line G1 and the second gate line G3.

In this embodiment, a gate line region having a low flatness is used as a light-transmissive region, and a relatively flat region is used as a reflective region which can prevent light leakage during the reflection, improve the area of the entire reflective region of the display panel, and improve the display effect in the reflective mode.

With reference to FIG. 19 and FIG. 20, the metal reflective layer 111 includes a third hollow portion 116 and a fourth hollow portion 117.

The third hollow portion 116 is located in the first light-transmissive region 115a, and the fourth hollow portion 117 is located in the second light-transmissive region 115b.

Since the metal reflective layer 111 blocks the backlight source, a hollow portion is provided on the metal reflective layer 111 at the light-transmissive region 115 to allow light emitted by the backlight source passing through the light-transmissive region 115. Therefore, the metal reflective layer 111 includes a third hollow portion 116 and a fourth hollow portion 117. The third hollow portion 116 is located in the first light-transmissive region 115a, and the fourth hollow portion 117 is located in the second light-transmissive region 115b, so that the light emitted by the backlight source can pass through the first light-transmissive region 115a and the second light-transmissive region 115b.

Figure 21:
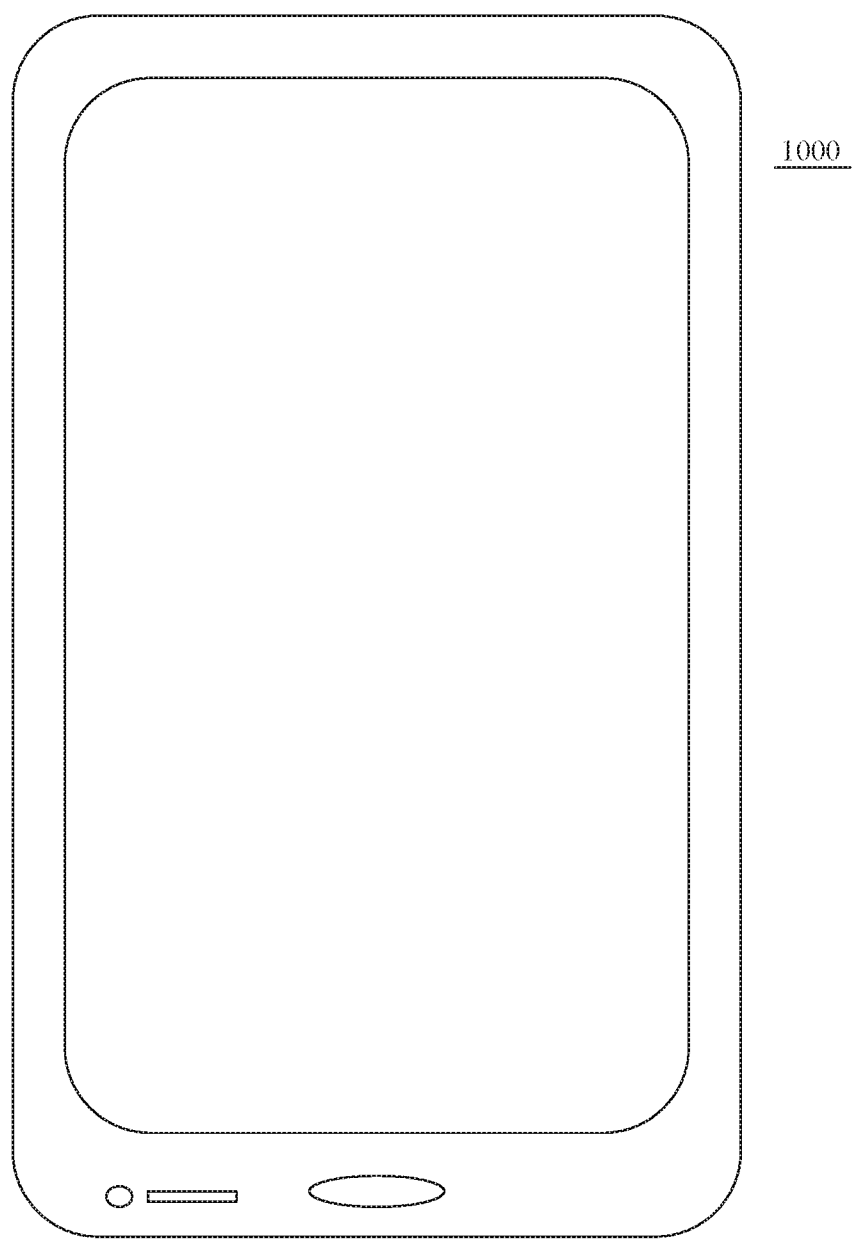
FIG. 21 is a front view of a display device according to an embodiment of the present disclosure.

Reference is made to FIG. 21, which is a front view of a display device according to an embodiment of the present disclosure. A display device 1000 is provided according an embodiment of the present disclosure, which includes the display panel as described above.

With reference to FIG. 21, the display device 1000 according to the embodiment of the present disclosure is a mobile phone, and the display device 1000 includes the display panel as described above. Further, the display device 1000 in the present disclosure may further include other well-known structures in addition to the display panel. The well-known structures are not described in detail in order to not obscure the key point of the present disclosure. It should be noted that the display device in the present disclosure is not limited to the mobile phone shown in FIG. 21, and may also be a device such as a computer, a television, or an electronic book.

With reference to FIG. 1 and FIG. 2, a method for manufacturing a display panel is provided according to an embodiment of the present disclosure. In the method, a base substrate 12 is provided. On the base substrate 12, multiple sub-pixels P arranged in an array, multiple gate lines G extending in a first direction X, multiple data lines D extending in a second direction Y, and a common electrode line com are formed, to form an array substrate 10. The first direction X is nonparallel with the second direction Y. Then the array substrate 10 is arranged opposite to a color filter substrate 20 with support pillars 40 located between the array substrate 10 and the color filter substrate 20.

The common electrode line com includes a first wire portion 11 extending in the first direction X.

The first wire portion 11 is located between adjacent sub-pixels P.

The sub-pixel P includes a first driving region PH1 and a second driving region PH2 arranged in the second direction Y.

The sub-pixel P further includes a first thin film transistor T1 and a second thin film transistor T2. The first thin film transistor T1 is located at a side of the first driving region PH1 close to the second driving region PH2, and the second thin film transistor T2 is located at a side of the second driving region PH2 close to the first driving region PH1.

The gate lines G are located between the first driving region PH1 and the second driving region PH2.

The data line D includes multiple support sections 13 each located at an intersection of the data line D with the first wire portion 11. An orthographic projection of the support section 13 on the base substrate 12 is a support region 50.

A side of the support pillar 40 close to the array substrate is located in the support region 50.

In the display panel manufactured by using the method according to the embodiment of the present disclosure, the length of the first wire portion 11 in the array substrate 10 in the second direction Y is greater than the length of the support pillar 40 in the second direction Y direction. If the support pillar 40 is cylindrical, the length of the support pillar 40 in the second direction Y is a diameter of the support pillar 40. Therefore, a relatively flat support region can be provided for the support pillar 40, which facilitates placement of the support pillar 40, thereby effectively improving the support stability of the support pillar 40. Since the gate line G has a small line width, the area corresponding to one gate line G may not reach the support area required by the support pillar 40. As a result, multiple gate lines G are required to together provide the support area for the support pillar 40. However, in order to ensure electrical insulation between adjacent gate lines C, the gate lines G are required to be spaced apart from each other by a large gap, which inevitably results in poor flatness and poor support stability of the support pillar 40.

The side of the support pillar 40 close to the array substrate 10 is located in the support region 50. That is, the side of the support pillar 40 close to the array substrate 10 is located at the intersection of the first wire portion 11 with the data line D, effectively avoiding a change in structures of the first driving region PH1 and the second driving region PH2 in the case of the support pillar 40 being arranged in other regions of the first wire portion 11 in the display panel, thereby effectively improving display quality of the display panel.

With reference to FIG. 6 and FIG. 8, a method for manufacturing a display panel is provided according to another embodiment of the present disclosure. In this method, a first hollow portion 15 is formed on the first wire portion 11. The first hollow portion 15 is located at an intersection of the first wire portion 11 with the data line D. An orthographic projection of the first hollow portion 15 on the base substrate 12 completely covers the support region 50.

In the display panel manufactured by using the method according to the embodiment of the present disclosure, the first wire portion 11 includes a first hollow portion 15. The first hollow portion 15 is located between the first wire portion 11 and the data line D, and the orthographic projection of the first hollow portion 15 on the base substrate 12 completely covers the support region 50. That is, the orthographic projection of the support pillar 40 on the base substrate 12 is in the orthographic projection of the first hollow portion 15 on the base substrate 12, so that the thickness of the array substrate at the region where the support region 50 is located is reduced, effectively reducing the difference between the thickness of the array substrate at the support region 50 and the thickness of the array substrate at a region around the support region 50.

With reference to FIG. 15 and FIG. 16, a method for manufacturing a display panel is provided according to another embodiment of the present disclosure. In this method, an electrode layer 19 is formed on the base substrate 12.

A second hollow portion 110 is formed in the electrode layer 19. An orthographic projection of the second hollow portion 110 on the base substrate 12 completely covers the support region 50.

In the display panel manufactured by using the method according to the embodiment of the present disclosure, the array substrate further includes an electrode layer 19, and the electrode layer 19 includes a second hollow portion 110. The orthographic projection of the second hollow portion 110 on the base substrate 12 completely covers the support region 50. That is, the orthographic projection of the support pillar 40 on the base substrate 12 is in the orthographic projection of the second hollow portion 110 on the base substrate 12, so that the thickness of the array substrate at the region where the support region 50 is located is reduced, effectively reducing the difference between the thickness of the array substrate at the support region 50 and the thicknesses of the array substrate at two sides of the support region 50 in the first direction X.

It can be seen from the above embodiments that, the display panel, the display device, and the method for manufacturing the display panel provided in the present disclosure have at least the following beneficial effects.

The length of the first wire portion in the second direction can be greater than the length of the support pillar in the second direction. Compared with the gate line, the first wire portion is more suitable to place the support pillar, effectively improving the support stability of the support pillar. The orthographic projection of each of the support sections on the base substrate is a support region, and the side of the support pillar close to the array substrate is located in the support region. That is, the side of the support pillar close to the array substrate is located at the intersection of the first wire portion with the data line, effectively avoiding a change in structures of the first driving region and the second driving region in the case of the support pillar being arranged in other regions of the first wire portion in the display panel, thereby effectively improving the display quality of the display panel.

The invention claimed is:
1. A display panel, comprising:
an array substrate and a color filter substrate opposite to each other; and
a plurality of support pillars located between the array substrate and the color filter substrate,
wherein each of the support pillars comprises:
a first face contacting the array substrate, and
a second face contacting the color filter substrate,
wherein the array substrate comprises:
a plurality of sub-pixels arranged in an array,
a plurality of gate lines extending in a first direction, and
a plurality of data lines extending in a second direction, wherein the first direction is nonparallel with the second direction;
wherein the array substrate further comprises a common electrode line, and wherein the common electrode line comprises a first wire portion extending in the first direction,
wherein the first wire portion is located between adjacent sub-pixels among the plurality of sub-pixels,
wherein each of the plurality of sub-pixels comprises a first driving region and a second driving region arranged in the second direction,
wherein the gate lines are located between the first driving region and the second driving region,
wherein the array substrate comprises a base substrate, and wherein the plurality of sub-pixels, the plurality of gate lines, the plurality of data lines and the common electrode line are arranged on the base substrate,
wherein at least one of the plurality of data lines comprises a plurality of support sections each located in an intersection region where the at least one of the plurality of data lines intersects with the first wire portion, and wherein an orthographic projection of each of the support sections on the base substrate is a support region, and
wherein, for each of the support pillars, the first face contacting the array substrate overlaps one of the support regions.

2. The display panel according to claim 1, wherein the at least one of the plurality of data lines further comprises a normal section located between adjacent support sections among the plurality of support sections, wherein
a length of the support sections in the first direction is greater than a length of the normal section in the first direction.

3. The display panel according to claim 2, wherein the array substrate further comprises a metal reflective layer, wherein
the metal reflective layer comprises a first side, a second side and a third side, the first side extends in the first direction, and the second side extends in the second direction; and
the third side intersects both the first side and the second side, and is adjacent to the support region.

4. The display panel according to claim 1, wherein the first wire portion comprises a first hollow portion, and the first hollow portion is located at an intersection of the first wire portion with the at least one of the plurality of data lines, wherein
an orthographic projection of the first hollow portion on the base substrate completely covers the support region.

5. The display panel according to claim 4, wherein
the first wire portion is divided by the first hollow portion; and
the common electrode line further comprises a second wire portion and a third wire portion, the second wire portion and the third wire portion are respectively arranged on two opposite sides of the first hollow portion in the second direction.

6. The display panel according to claim 4, wherein the first wire portion comprises a normal wire section and a widened wire section, and the widened wire section intersects the at least one of the plurality of data lines, wherein
a length of the first wire portion in the second direction is a width of the first wire portion; and
a width of the widened wire section is greater than a width of the normal wire section.

7. The display panel according to claim 4, wherein a thickness of the support sections is D1, and a thickness of the first wire portion is D2, wherein |D1−D2|<0.1 μm, D1>0, and D2>0.

8. The display panel according to claim 4, wherein
the first wire portion comprises a first edge, and the first edge is adjacent to the support region; and
the array substrate further comprises a first trench, and the first trench is located between the support region and the first edge.

9. The display panel according to claim 8, wherein in the first direction, a shortest distance between the first edge and a support section adjacent to the first edge is d1, wherein 1 μm≤d1≤3 μm.

10. The display panel according to claim 1, wherein the array substrate further comprises an electrode layer, wherein
the electrode layer comprises a second hollow portion, and an orthographic projection of the second hollow portion on the base substrate completely covers the support region.

11. The display panel according to claim 10, wherein a thickness of the support sections is D1, and a thickness of the electrode layer is D3, wherein |D1−D3|<0.1 μm, D1>0, and D3>0.

12. The display panel according to claim 10, wherein
the electrode layer comprises a second edge, and the second edge is recessed towards the inside of the electrode layer to form the second hollow portion; and
the array substrate further comprises a second trench that surrounds a part of the support region, and the second trench is located between the support region and the second edge adjacent to the support region.

13. The display panel according to claim 12, wherein in the first direction, a shortest distance between the second edge and a support section adjacent to the second edge is d2, wherein 1 μm≤d2≤3 μm.

14. The display panel according to claim 1, wherein each of the plurality of sub-pixels further comprises a first thin film transistor and a second thin film transistor, the first thin film transistor is located at a side of the first driving region close to the second driving region, and the second thin film transistor is located at a side of the second driving region close to the first driving region, and each of the plurality of sub-pixels further comprises a main thin film transistor, a first pixel electrode located in the first driving region, and a second pixel electrode located in the second driving region, wherein
the gate lines comprise a main gate line, a first gate line, and a second gate line; and
a source of the main thin film transistor is connected to the at least one of the plurality of data lines, a first drain of the main thin film transistor is connected to a source of the first thin film transistor, and a gate of the main thin film transistor is connected to the main gate line, a second drain of the main thin film transistor is connected to a source of the second thin film transistor, a drain of the first thin film transistor is connected to the first pixel electrode, and a gate of the first thin film transistor is connected to the first gate line, a drain of the second thin film transistor is connected to the second pixel electrode, and a gate of the second thin film transistor is connected to the second gate line.

15. The display panel according to claim 14, further comprising:
one or more light-transmissive regions.

16. The display panel according to claim 15, wherein the one or more light-transmissive regions each comprise a first light-transmissive region and a second light-transmissive region, wherein
the first driving region comprises the first light-transmissive region, and the first light-transmissive region is located between the main gate line and the first gate line; and
the second driving region comprises the second light-transmissive region, and the second light-transmissive region is located between the main gate line and the second gate line.

17. The display panel according to claim 16, wherein the array substrate further comprises a metal reflective layer, wherein the metal reflective layer comprises a third hollow portion and a fourth hollow portion, wherein
the third hollow portion is located in the first light-transmissive region, and the fourth hollow portion is located in the second light-transmissive region.

18. A display device, comprising a display panel, wherein the display panel comprises:
an array substrate and a color filter substrate opposite to each other; and
support pillars located between the array substrate and the color filter substrate,
wherein each of the support pillars comprises:
a first face contacting the array substrate, and
a second face contacting the color filter substrate, wherein
the array substrate comprises:
a plurality of sub-pixels arranged in an array,
a plurality of gate lines extending in a first direction, and
a plurality of data lines extending in a second direction, wherein the first direction is nonparallel with the second direction;
wherein the array substrate further comprises a common electrode line, and wherein the common electrode line comprises a first wire portion extending in the first direction,
wherein the first wire portion is located between adjacent sub-pixels among the plurality of sub-pixels,
wherein each of the plurality of sub-pixels comprises a first driving region and a second driving region arranged in the second direction,
wherein the gate lines are located between the first driving region and the second driving region,
wherein the array substrate comprises a base substrate, and wherein the plurality of sub-pixels, the plurality of gate lines, the plurality of data lines and the common electrode line are arranged on the base substrate,
wherein each of the data lines comprises a plurality of support sections each located in an intersection region where the data line intersects with the first wire portion, and wherein an orthographic projection of each of the support sections on the base substrate is a support region, and
wherein, for each of the support pillars, the first face contacting the array substrate overlaps one of the support regions.

19. A method for manufacturing a display panel, comprising:
providing a base substrate;
forming, on the base substrate, a plurality of sub-pixels arranged in an array, a plurality of gate lines extending in a first direction, a plurality of data lines extending in a second direction, and a common electrode line, to form an array substrate; and
arranging the array substrate opposite to a color filter substrate, with support pillars located between the array substrate and the color filter substrate,
wherein each of the support pillars comprises:
a first face contacting the array substrate, and
a second face contacting the color filter substrate,
wherein the first direction is nonparallel with the second direction,
wherein the common electrode line comprises a first wire portion extending in the first direction,
wherein the first wire portion is located between adjacent sub-pixels among the plurality of sub-pixels,
wherein each of the plurality of sub-pixels comprises a first driving region and a second driving region arranged in the second direction,
wherein the gate lines are located between the first driving region and the second driving region,
wherein at least one of the plurality of data lines comprises a plurality of support sections each located in an intersection region where the at least one of the plurality of data lines intersects with the first wire portion, and wherein an orthographic projection of each of the support sections on the base substrate is a support region, and wherein, for each of the support pillars, the first face contacting the array substrate overlaps one of the support regions.

20. The method for manufacturing according to claim 19, further comprising:

forming a first hollow portion on the first wire portion, wherein the first hollow portion is located at an intersection of the first wire portion with the at least one of the plurality of data lines; and an orthographic projection of the first hollow portion on the base substrate completely covers the support region.

\* \* \* \* \*